United States Patent
Trinh Quang et al.

(10) Patent No.: US 10,706,904 B2
(45) Date of Patent: Jul. 7, 2020

(54) DYNAMIC REFERENCE SCHEME FOR IMPROVING READ MARGIN OF RESISTIVE MEMORY ARRAY

(71) Applicants: NATIONAL UNIVERSITY OF SINGAPORE, Singapore (SG); AGENCY FOR SCIENCE, TECHNOLOGY AND RESEARCH, Singapore (SG)

(72) Inventors: Kien Trinh Quang, Singapore (SG); Massimo Alioto, Singapore (SG); Sergio Ruocco, Singapore (SG)

(73) Assignees: NATIONAL UNIVERSITY OF SINGAPORE, Singapore (SG); AGENCY FPR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 16/234,876

(22) Filed: Dec. 28, 2018

(65) Prior Publication Data

US 2019/0206469 A1    Jul. 4, 2019

Related U.S. Application Data

(60) Provisional application No. 62/613,057, filed on Jan. 3, 2018.

(51) Int. Cl.
  *G11C 7/00*    (2006.01)
  *G11C 11/16*    (2006.01)

(52) U.S. Cl.
  CPC ...... *G11C 11/1673* (2013.01); *G11C 11/1655* (2013.01)

(58) Field of Classification Search
  CPC .................................................. G11C 5/147
  USPC .................................................. 365/189.09
  See application file for complete search history.

(56) References Cited

U.S. PATENT DOCUMENTS

| | | | |
|---|---|---|---|
| 8,837,210 B2 | 9/2014 | Jefremow | |
| 8,917,562 B2 | 12/2014 | Wang | |
| 2004/0264249 A1 | 12/2004 | Ho | |
| 2013/0272060 A1 | 10/2013 | Andre | |
| 2014/0056059 A1 | 2/2014 | Mueller | |
| 2014/0063923 A1 | 3/2014 | Jefremow | |
| 2015/0194210 A1* | 7/2015 | Kobayashi | G11C 13/0021 365/148 |

(Continued)

OTHER PUBLICATIONS

Abu-Rahma, M., et al. "Characterization of SRAM sense amplifier input offset for yield prediction in 28nm CMOS," in Proc. Of CiCC, Apr. 2011.

(Continued)

*Primary Examiner* — Hoai V Ho
(74) *Attorney, Agent, or Firm* — Volpe and Koenig, P.C.

(57) ABSTRACT

A method of providing a reference voltage for reading of a resistive memory array, and a read circuit for reading of a resistive memory array. The method comprises the steps of generating a first reference voltage when a bitline of the resistive memory array is in a first resistance state, and generating a second reference voltage when the bitline is in a second resistance state; wherein the first reference voltage is different from the first reference voltage and the first resistance state is different from the second resistance state.

16 Claims, 11 Drawing Sheets

(56) References Cited

U.S. PATENT DOCUMENTS

2015/0255136 A1  9/2015 Mueller

OTHER PUBLICATIONS

Apalkov, D., et al. "Spin-transfer torque magnetic random access memory (STT-MRAM)," ACM Journal on Emerging Technologies in Computing Systems (JETC), vol. 9, No. 2, pp. 1-35, May 2013.
Chen, E., et al. "Advances and Future Prospects of Spin-Transfer Torque Random Access Memory," in IEEE Trans. Magn., vol. 46, No. 6, pp. 1873-1878, Jun. 2010.
Chen, Y., et al. "A 130 nm 1.2 V/3.3 V 16 Kb Spin-Transfer Torque random access memory with nondestructive self-reference sensing scheme," IEEE JSSC, vol. 47, No. 2, pp. 560-573, Feb. 2012.
Debrosse, J., et al. "A high-speed 128-kb MRAM core for future universal memory applications," JSSC, vol. 39, No. 4, pp. 678-683, Apr. 2004.
Fong, X., et al. "Failure mitigation techniques for 1T-1MTJ spin-transfer torque MRAM bit-cells," IEEE Trans. on VLSI Syst., vol. 22, No. 2, pp. 384-395, Feb. 2014.
Fong, X., et al. "KNACK: A hybrid spin-charge mixed-mode simulator for evaluating different genres of spin-transfer torque MRAM bit-cells," in 2011 Int. Conf. on Simulation of Semiconductor Processes and Devices, pp. 51-54, Sep. 2011.
Fong, X., et al. Manual for "SPICE models for magnetic tunnel junctions based on mono-domain approximation", https://nanohub.org/resources/19048, Aug. 2013.
Huai, Y., et al. "PMTJ driven STT-MRAM with 300mm process", in 2015 IEEE Magnetics Conference (INTERMAG), Beijing, pp. 1-2, 2015.
Jeong, G. et al. "0.24 µm 2.0 V 1T1MTJ 16-Kb Nonvolatile Magnetoresistance RAM with Self-reference Sensing Scheme," in IEEE JSSC, vol. 38, No. 11, pp. 1906-1910, Nov. 2003.
Kang, W. et al., "Dynamic Reference Sensing Scheme for Deeply Scaled STT-MRAM," in 2015 IEEE International Memory Workshop (IMW), Monterey, CA, pp. 1-4, 2015.
Kang, W., et al. "Dynamic Dual-Reference Sensing Scheme for Deep Submicrometer STT-MRAM," in IEEE TCAS I: Regular Papers, vol. 64, No. 1, pp. 122-132, Jan. 2017.
Kim, J., et al. "A novel sensing circuit for deep submicron spin transfer torque MRAM (STT-MRAM)," IEEE Trans. on VLSI Syst., vol. 20, No. 1, pp. 181-186, Jan. 2012.
Kim, J., et al. "STT-MRAM Sensing Circuit with Self-body Biasing in Deep Submicron Technologies," in IEEE Trans. on VLSI Syst., vol. 22, No. 7, pp. 1630-1634, Jul. 2014.
Koike, H., et al. "A new sensing scheme with high signal margin suitable for Spin-Transfer Torque RAM," Proc. 2011 Int. Symp. VLSI Technol. Syst. Appl., pp. 1-2, Apr. 2011.
Li, H., et al. "An overview of nonvolatile memory technology and the implication for tools and architectures," in Design, Automation & Test in Europe Conference and Exhibition, pp. 731-736, Apr. 2009.
Lin, C.J., et al. "45nm low power CMOS logic compatible embedded STT-MRAM utilizing a reverse-connection 1T/1MTJ cell," 2009 IEEE Int. Electron Devices Meeting, pp. 1-4, Dec. 2009.
Liu, M., et al. Chapter 3 in Demystifying Switched Capacitor Circuits, pp. 27-88, Burlington, USA, Elsevier, May 2006.
Na, T. et al., "An Offset-Tolerant Dual-Reference-Voltage Sensing Scheme for Deep Submicrometer STT-RAM," in IEEE Trans. VLSI Syst., vol. 24, No. 4, pp. 1361-1370, Apr. 2016.
Na, T., et al. "A Double-Sensing-Margin Offset-Canceling Dual-Stage Sensing Circuit for Resistive Nonvolatile Memory," in IEEE Trans. on Circuits and Systems II: Express Briefs, vol. 62, No. 12, pp. 1109-1113, Dec. 2015.
Na, T., et al. "An Offset-Canceling Triple-Stage Sensing Circuit for Deep Submicrometer STT-RAM," in IEEE Trans. on VLSI Syst. vol. 22, No. 7, pp. 1620-1624, Jul. 2014.
Pelgrom, M.J.M. et al., "Matching properties of MOS transistors," IEEE JSSC, vol. 24, No. 5, pp. 1433-1440, Oct. 1989.
Process Integration Difficult Challenges Chapter, 2013 International Technology Roadmap for Semiconductors [Online] Available: http://www.itrs2.net/2013-itrs.html (2013PIDS.pdf).
Ren, F., et al. "A body-voltage-sensing-based short pulse reading circuit for spin-torque transfer RAMs (STT-RAMs)," in Proc. of ISQED 2012, Santa Clara (CA), pp. 275-282, 2012.
Tanizaki, H., et al. "A high-density and high-speed 1T-4MTJ MRAM with voltage offset self-reference sensing scheme," 2006 IEEE ASSCC 2006, No. 1, pp. 303-306, Nov. 2006.
Trinh, K., et al. "Modeling the impact of dynamic voltage scaling on 1T-1J STT-RAM write energy and performance," IEEE ISCAS 2015, pp. 2313-2316, May 2015.
Trinh, K., et al. "Novel Boosted-Voltage Sensing Scheme for Variation-Resilient STT-MRAM Read," in IEEE TCAS-I: Regular Papers, vol. 63, No. 10, pp. 1652-1660, Oct. 2016.
Trinh, K., et al. "Voltage Scaled STT-MRAMs Towards Minimum-Energy Write Access," in IEEE JETCAS, vol. 6, No. 3, pp. 305-318, Apr. 2016.
Trinh, K., et al., "Voltage Scaled STT-MRAMs Towards Minimum-Energy Write Access," IEEE JETCAS, vol. 1, No. 1, pp. 1-14, 2016.
Yuasa, S., et al. "Giant room-temperature magnetoresistance in single-crystal Fe/MgO/Fe magnetic tunnel junctions," Nature Materials, vol. 3, No. 12, Dec. 2004.
Zheng, T., et al. "Variable-energy write STT-RAM architecture with bit-wise write-completion monitoring," Int. Symp. Low Power Electron. Des., pp. 229-234, Sep. 2013.

* cited by examiner

DYNAMIC REFERENCE SCHEME FOR IMPROVING READ MARGIN OF RESISTIVE MEMORY ARRAY

CROSS-REFERENCE TO RELATED APPLICATION

This application claims the benefit of priority of U.S. Provisional Application No. 62/613,057 filed on Jan. 3, 2018, the content of which is incorporated herein by reference in its entirety for all purposes.

FIELD OF INVENTION

The present invention relates broadly to a dynamic reference scheme for improving read margin of resistive memory arrays, and in particular can be applied to spin-transfer torque memory (STT-MRAM) array.

BACKGROUND

Any mention and/or discussion of the prior art throughout the specification should not be considered, in any way, as an admission that this prior art is well known or forms part of common general knowledge in the field.

Amongst other resistive memories, Spin-Transfer-Torque-Magnetic RAM (STT-MRAM) is widely considered as the most promising candidate for future non-volatile embedded memories [2], [1]. The memory bitcell typically consists of Magnetic Tunnel Junction (MTJ) 100 driven by an access transistor 102 (see FIG. 1). The MTJ 100 serves as a memory element, as it can operate in the parallel (P) or antiparallel (AP) state, as determined by the relative direction of the magnetization of the MTJ Free layer (FL) compared to the MTJ Pinned layer (PL). Since the resistance of the MTJ 100 is lower at P and higher at AP, data stored in the bitcell is retrieved by sensing the difference in the MTJ 100 resistance.

A number of sensing schemes have been proposed to implement for STT-MRAMs, which are either voltage sensing, [4]-[6], or current sensing [7]-[13] schemes (i.e., by sensing either the current or the voltage across the bitline).

The current sensing circuit was first introduced in [7] with adopting a symmetrical current averaging reference generator. Many enhancements and modifications have been subsequently proposed in [7]-[13]. Particularly, source degeneration and body biasing for mitigating impacts of process variation in the data path was presented in [8] and [9], respectively. Offset canceling techniques, which seek to eliminate the mismatch between data sensing and reference path, were multiply proposed in [10]-[13], typically by introducing one or more sampling stages.

Techniques of dual reference and dynamic reference have been subsequently mentioned in [12] and [13] for the current sensing scheme. Authors in [13] actually introduced after-testing optimization for the reference value to attain optimum bit error rate (BER). Similarly, the work in [12] proposed a dual reference scheme where the reference voltage can also be dynamically selected by controlling a programmable multiplexer after acquiring the statistical data of the memory array. Current sensing generally exhibits better robustness than voltage sensing, as its read BER under variations can be approximately as low as the intrinsic bitcell error rate which is known to be an absolute lower bound. However, current sensing is known to be unsuited for operation at voltages lower than nominal, thus prohibiting energy reductions through voltage scaling [5].

Conventional voltage sensing (CVS) [5] method in contrast to counterpart current sensing does not attain as good BER as current sensing. However, the scheme is more suitable for low-power and low voltage applications. The work in [5] introduced a self-referenced voltage sensing scheme that performs a destructive read involving four steps of successive read/write, at the cost of substantially increased energy per access and access time. A non-destructive self-reference scheme was proposed in [6] by exploiting the high roll-off slope of the MTJ resistance in AP state as a function of its bias voltage. This scheme still uses multiple read steps, and is effective only under large critical switching current (200-500 µA), which makes it unsuitable for technologies below 90 nm. Furthermore, the work in [5] proposed boosted voltage sensing, which amplifies the bit-line voltage using a simple switched-cap voltage booster. The circuit not only achieves the low BER (at the order of 1E-9) but shows relatively good performance across the practical voltage range (0.7V-1.2V) [3] of STT-MRAMs.

Other proposed approaches are briefly described in the following.

1. Dual Reference Cell Sensing Scheme for Non-Volatile Memory [14] (JIANQ CHYUN Intellectual Property Office, Taiwan, 2004), US Pat. Publ. No. 2004/0264249 A1 proposes a circuit for non-volatile memory with dual reference and two-stage amplifying, which attains high robustness to process variation. At the first stage, the bitcell sampling current is compared to high and low reference by two adjustable bias amplifiers. The output of the first stage amplifiers is sent to second stage amplifier to determine the final readout value. The main drawback of this scheme is to double the first amplifying stage, thus, consume large energy and area.

2. Self-Reference Sense amplifier for Spin Transfer Torque [15] (Everspin Technologies, Inc., 2013), US Pat. Publ. No. US 2013/0272060 A1 proposes a sensing scheme without requiring external reference, involving three stages. At the first stage MTJ state is sampled (into a capacitor) then at the second stage the cell is overwritten (by a known value) before the bitcell is sampled again for generating the reference. At the third stage, readout bit is determined by comparing the sampled voltage to the reference. This scheme performs destructive read which eventually requires an additional write back stage (the fourth stage), thus, consuming extremely large energy (since writing is an energy-consuming operation for STT-MRAM [1]-[3]) and degrading the overall performance.

3. Body Voltage Sensing Based on Short Pulse Reading Circuit [16] (University of California, 2014), U.S. Pat. No. 8,917,562 B2 proposes a modification on the sensing circuit in [8] where the body of the PMOS biasing transistor is connected to the sampling output. This was quantitatively proven to mitigate the process variation impact on the sensing node, and hence, improve the read-ability. Since this proposed circuit follows the traditional current sensing scheme, it essentially still suffers from larger energy consumption and is unsuited for low voltage operations.

4. Symmetrical Differential Sensing Method and System for STT-MRAM [17] (Infineon Technologies AG, 2015), US Pat. Publ. No. US 2014/0056059 A1 proposes a circuit and current sensing method for STT-MRAMs where reference and data subsequently go through the same sampling phases and paths (sense and inverse sense). Consequently, the offset between reference and data paths is theoretically canceled. The drawback of this scheme is the multi-stage sensing, which degrades the read performance and consumes more energy.

5. Mismatch Error Reduction Method and System for STT MRAM [18] (Infineon Technologies AG, 2014), US Pat. Publ. No. US 2014/0063923 A1 proposes a circuit and current sensing method for STT-MRAMs where an additional sampling phase is introduced in order to record to offset voltage of reference and data sensing path. This offset value is stored in a capacitor and is then used to compensate the offset between the two paths during the actual sensing phase. The proposed sensing method is still based on the current sensing scheme and requires dual stage sensing and the stored offset value may not be accurate enough under low voltage operations. The main drawback of this scheme is the requirement for extra sensing stages, which result in high energy and poorer performance.

6. Differential Sensing Method and System for STT-MRAM [19] (Infineon Technologies AG, 2014), U.S. Pat. No. 8,837,210 B2 proposes a circuit for sensing STT-MRAM cell where the reference and sampling current is fed through the same set of transistors without using current mirror, thus, eliminating the mismatch of reference and sensing current. The proposed method has similar disadvantages in performance and energy as in [16], [17], i.e., requires multi-stage sensing and is not suitable for low-voltage operations.

Embodiments of the present invention seek to address at least one of the above problems.

SUMMARY

In accordance with a first aspect of the present invention, there is provided a method of providing a reference voltage for reading of a resistive memory array, the method comprising the steps of generating a first reference voltage when a bitline of the resistive memory array is in a first resistance state, and generating a second reference voltage when the bitline is in a second resistance state; wherein the first reference voltage is different from the first reference voltage and the first resistance state is different from the second resistance state.

In accordance with a first aspect of the present invention, there is provided a read circuit for reading of a resistive memory array, the circuit comprising a reference voltage generating circuit for generating a first reference voltage when a bitline of the resistive memory array is in a first resistance state, and for generating a second reference voltage when the bitline is in a second resistance state, wherein the first reference voltage is different from the first reference voltage and the first resistance state is different from the second resistance state.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1A:
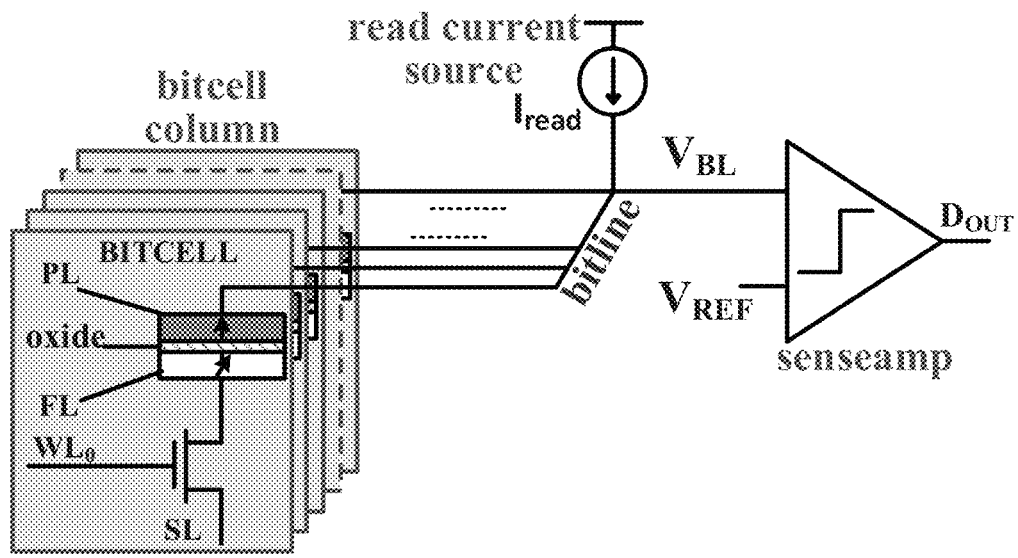
FIG. 1A shows a schematic drawing illustrating a memory bitcell consisting of Magnetic Tunnel Junction (MTJ) driven by an access transistor.

Embodiments of the present Invention provide a dynamic reference (DR) scheme for resistive memory devices, including, but not limited to STT-MRAMs, Magnetic RAM (MRAM), phase change memory (PC-RAM) and resistive RAM (RRAM or ReRAM). Embodiments of the invention provide a technique to enlarge the nominal read sensing margin to accommodate for a larger number of standard deviations before failure (as determined by process/voltage/temperature variations), thus improving the read robustness and related yield. Generally, example embodiments use smaller reference voltage when reading high resistance state (e.g., the Magnetic Tunnel Junction (MTJ) in anti-parallel state in STT-MRAMs), which has larger bitline voltage. Conversely, larger reference voltage is adopted when reading low resistance state (i.e., the MTJ Parallel (P) state). Since the bitline voltage carries information whether the resistance is high or low, this bitline voltage will be used as the input for the circuitry generating the dynamic reference voltage (REFGEN) according to example embodiments. Such circuitry is generally designed so that it will generate larger reference when input bitline (BL) voltage is smaller (P state) and smaller reference when BL voltage is larger. The REFGEN circuitry according to example embodiments can hence be implemented by amplifier circuits with a gain that is set by the ratio of the desired dynamic voltage range and the given bitline voltage range. For example, in STT-MRAM the intrinsic variation of the bitline voltage is in the order of tens of mVs, and significant sensing margin improvement is achieved with a dynamic voltage range of very few tens of mVs, hence a gain lower than one is sufficient (i.e., attenuator) according to example embodiments. By construction, the amplifier/attenuator in REFGEN does not need to be linear, and can hence be implemented with very low area and energy overhead according to example embodiments.

The dynamic reference scheme according to example embodiments is described herein for STT-MRAMs, but can be applied to any other resistive memory (e.g., PC-RAM, RRAM [1], [2]). In addition, since the technique according to example embodiments is to modify the reference and does not modify the bitcell, example embodiments of the present invention can jointly be used with several other yield-enhancement techniques.

Compared to existing techniques, the robustness (BER) enhancement approach in example embodiments of the present invention has a number of differences and advantages. Firstly, most of the existing techniques aimed to mitigate the effect of process variations on the sensing path (i.e., from bitcell to sense amplifier) or the reference path (i.e., from reference voltage source to sense amplifier), while using a fixed reference—in embodiments of the present invention the reference voltages for sensing P and AP states are dynamically changed depended on sensing state. Consequently, the effective sensing margin is advantageously enlarged by the dynamic reference voltage range, thus improving the robustness (i.e., BER). Secondly, departing from the concept of dual reference in [12] and dynamic reference in [13], the reference point according to embodiments of the present invention is adaptively changed depending on the current state of the bitcell being read, rather than being preliminarily and definitively tuned [12] or selected [13] based on offline calibration data. As a further advantage, the sensing scheme according to embodiments of the present invention does not require multi-stage sensing as in [10]-[13], thus avoiding its performance and energy degradation. In addition, being a voltage sensing scheme, the scheme according to embodiments of the present invention is suitable for low-voltage operations, as opposed to current sensing scheme in [7]-[13]. Also, since the technique according to embodiments of the present invention modifies only the reference path, it can be jointly used with several other existing bitline boosting technique (see, e.g., [5], [25]) to enhance further the memory read-ability.

Furthermore, the technique according to example embodiments can provide read yield enhancement while requiring only an attenuator as the reference generator, thus advantageously reducing the energy and area cost of the above patent. Also, the dynamic reference scheme according to embodiments of the present invention does not perform destructive read and write back, thus substantially reducing the energy consumption. Furthermore, the dynamic reference technique according to example embodiments requires only single-stage sensing, and is hence intrinsically energy-efficient and suitable for low-power applications.

For STT-MRAMs used in the embodiments described herein by way of example, not limitation, read accesses are much more sensitive to variations compared to write. Indeed, write-ability can always be improved by sacrificing the energy per access [3], [5]. On the other hand, read-ability is limited by the unavoidable tradeoff between read decision (i.e., wrong readout state) and read disturbance (i.e., unintentionally flipping the bitcell) [5]-[13]. Indeed, the former is always improved under larger read current (or voltage), but this leads to a larger probability of the latter.

Figure 2A:
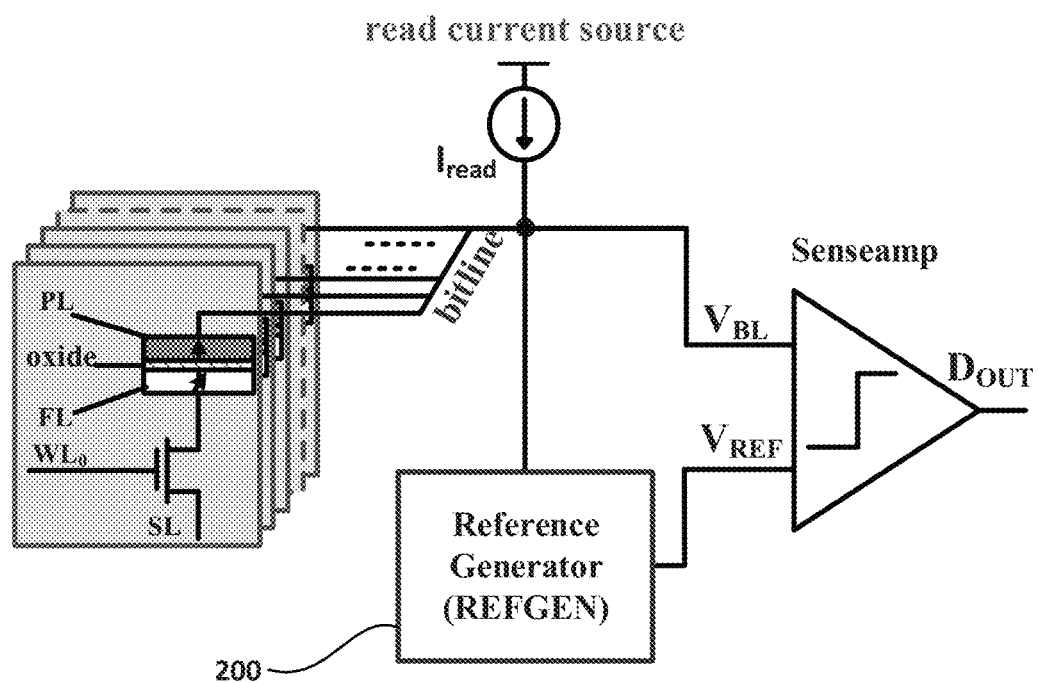
FIG. 2A shows a schematic drawing illustrating a memory bitcell consisting of Magnetic Tunnel Junction (MTJ) driven by an access transistor and with a circuit for generating a dynamic reference voltage for sensing, according to an example embodiment.
Figure 2B:
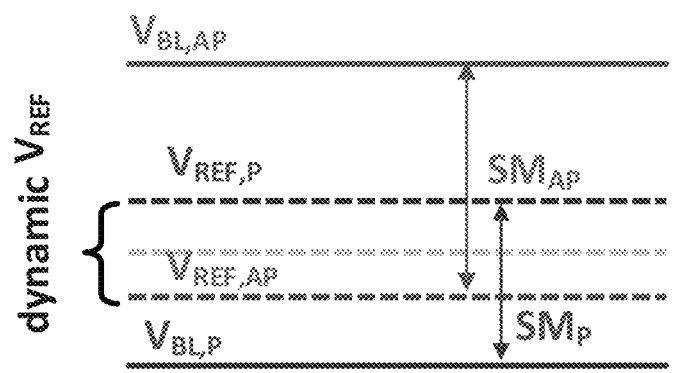
FIG. 2B shows graphs illustrating the working principle of the circuit for generating a dynamic reference voltage for sensing, according to an example embodiment.

Embodiments of the present Invention provide a dynamic reference (DR) scheme for resistive memory devices such as but not limited to, STT-MRAMs, MRAM, PC-RAM and RRAM. Embodiments of the present invention advantageously enlarge the nominal read sensing margin to accommodate for a larger number of standard deviations before failure, thus improving the read robustness. Particularly, as shown in FIG. 2B, the embodiments of the present invention use a smaller reference $V_{REF}$@AP when reading AP state (i.e., high resistance) compared to a larger reference $V_{REF}$@P used when reading P state (i.e., low resistance). Since the BL voltage $V_{BL}$ carries information whether the state of the MTJ is P or AP, this voltage is used as the input for the REFGEN circuit 200 according to an example embodiment as shown in FIG. 2A. REFGEN circuit 200 is preferably designed so that it will generate the larger reference $V_{REF}$@P when $V_{BL}$ is smaller (P state) and the smaller reference $V_{REF}$@AP when $V_{BL}$ is larger (AP state). Quantitatively, as the intrinsic variation of the bitline voltage is typically about a few to ~10 mV, a separation of ~15-20 mV between $V_{REF}$@P and $V_{REF}$@AP can be expected to bring the improvement of 1-σ sensing margin. In addition, the input bitline difference from AP to P is typically about 80 mV [5] and hence, REFGEN circuit 200 can be implemented as a linear attenuator circuit. That also means the area and energy overhead by introducing REFGEN circuit 200 is advantageously minimal.

It is noted that existing techniques, which leave an option for the reference to be selected [12] or to be tuned [13] offline after obtaining the array statistical information, still actually fix the reference used. In contrast, in embodiments of the present invention, the reference voltage is changed adaptively depended on the state of the read bitcell MTJ. In other words, the reference value in embodiments of the present invention is a function of the bitline voltage, and thus can be varied temporally and spatially, i.e., from one read operation to another and from one cell to another cell due to the process mismatch. The effectiveness of the scheme according to example embodiments can be defined by how much the reference value in AP state is different from that in P state.

Dynamic Reference Variability Model According to Example Embodiments

As mentioned above, in conventional single-ended voltage sensing (CVS) schemes, a fixed reference voltage $V_{REF}$ is adopted (see FIGS. 1A and 1B), which defines the range of bitline voltages (i.e., MTJ resistances) that are interpreted as high and low by the sense amplifier 104. The robustness of read against variations is quantified by the read sensing margin SM $$SM_X = |V_{REF} - V_{BL,X} - V_{OS}| \tag{1a}$$

where X denotes either P or PA state, and $V_{OS}$ is the sense amplifier offset.

Due to random variations, the sensing margin is a random variable, and its variability $\sigma_{SM}/\mu_{SM}$ is defined as the ratio between its standard deviation $\sigma_{SM}$ and its mean value $\mu_{SM}$. Lower variability entails better robustness against variations. As was shown in [5], $V_{REF}$ can be optimized to minimize the overall BER by making $\sigma_{SM}/\mu_{SM}$ in P and AP states equal, and the resulting sensing margin variability turns out to be [5]

$$\left(\frac{\sigma_{SM}}{\mu_{SM}}\right)_{opt} = \frac{\sigma_{SM,P} + \sigma_{SM,AP}}{\mu_{V_{BL,AP}} - \mu_{V_{REF,AP}} + \mu_{V_{REF,P}} - \mu_{V_{BL,P}}}. \tag{1b}$$

where $\mu_Z$ and $\sigma_Z$ are mean and standard deviation of the generic variable Z, which refers to SM for the sensing margin, $V_{BL}$ for the bitline voltage, $V_{REF}$ for the reference voltage, in both the P and AP state $$\mu_{SM,X} = |\mu_{V_{REF}} - \mu_{V_{BL,X}}| \tag{1c}$$

$$\sigma_{SM,X} = \sqrt{\sigma_{V_{OS}}^2 + \sigma_{V_{BL,X}}^2 + \mu_{V_{REF,X}}^2} \tag{1d}$$

where it was considered that variations contributed by the sense amplifier, the bitline and the reference voltage are uncorrelated.

Under fixed reference voltage, $\mu_{V_{REF,AP}}$ is equal to $\mu_{V_{REF,P}}$ in equation (1b), such that the resulting optimum variability in equation (1b) can be rewritten as $$\left(\frac{\sigma_{SM}}{\mu_{SM}}\right)_{CVS} = \frac{\sigma_{SM,P} + \sigma_{SM,AP}}{\mu_{V_{BL,AP}} - \mu_{V_{BL,P}}} \geq \frac{\sigma_{BL,P} + \sigma_{BL,AP}}{\mu_{V_{BL,AP}} - \mu_{V_{BL,P}}} = \left(\frac{\sigma_{SM}}{\mu_{SM}}\right)_{bitcell} \tag{1e}$$

From equations (1d) and (1e), the latter can be approached only when the reference voltage and the sense amplifier variability are made negligible compared to the bitcell voltage variability. This is a common design target in practical cases according to example embodiments, as it preferably ensures that the array is kept close to its best robustness.

The BER in the MTJ state X (with X being AP or P) depends on the sensing margin variability $\sigma_{SM,X}/\mu_{SM,X}$ in the same state [5]

$$BER_X = \frac{1}{2}\left[1 + \text{erf}\left(-\frac{1}{\sqrt{2}} \cdot \frac{1}{\sigma_{SM,X}/\mu_{SM,X}}\right)\right] \tag{2}$$

where erf(x) is the Gauss error function [20].

If one now considers a different scenario according to example embodiments of the present invention where different reference voltages are available, the variability in equation (1e) can be further improved by enlarging the difference between the bitline and the reference voltage via appropriate choice of the reference voltage. In particular, a lower (higher) $V_{REF}$ is chosen when the bitline voltage is high (low). Such dynamic reference voltage widens the nominal range of bitline voltages that are interpreted as high (low), creating a larger margin that accommodates for wider variations (i.e., reduces $\sigma_{SM,X}/\mu_{SM,X}$), thus reducing the BER. More quantitatively, if one considers the voltage sensing scheme with dynamic reference generator according to an example embodiment (REFGEN circuit 200) in FIGS. 2A and B, which dynamically adjusts $V_{REF}$ based on $V_{BL}$, as opposed to the fixed $V_{REF}$ in FIG. 1B, and, for simplicity, one can assume that REFGEN circuit 200 generates an output voltage $V_{REF}$ that is linearly related to its input voltage $V_{BL}$, this leads to $$V_{REF} = V_{bias} - A_V V_{BL} \tag{1}$$

$$\mu_{V_{REF}} = \mu_{V_{bias}} - \mu_{V_{BL}} \mu_{A_V} \tag{2}$$

$$\sigma_{V_{REF}} = \sqrt{\sigma_{V_{bias}}^2 + \sigma_{V_{BL}}^2 \mu_{A_V}^2 + \mu_{V_{BL}}^2 \sigma_{A_V}^2} \tag{3}$$

where $V_{bias}$ is the DC bias that represents the value of $V_{REF}$ extrapolated for zero bitline voltage, $A_V$ is the voltage gain of REFGEN circuit 200, which are both realistically assumed to be subject to variations. $\mu_{V_{bias}}$ and $\sigma_{V_{bias}}^2$ are the mean and the variance of $V_{bias}$, whereas the mean $\mu_{A_V}$ and the variance $\sigma_{A_V}^2$ refer to $A_V$. For practical bitline voltage swings $\mu_{V_{BL,AP}} - \mu_{V_{BL,P}}$ of 80-100 mV [5], an increase of few tens of mV (e.g., 20 mV) typically corresponds to the sensing margin improvement by a few standard deviations and hence a BER improvement by two-three orders of magnitude [9]. From equation (3), this means that REFGEN circuit 200 preferably has a voltage gain such that $A_V \cdot (V_{BL,AP} - V_{BL,P})$ is only a few tens of mVs, i.e. lower than $V_{BL,AP} - V_{BL,P}$. In other words, REFGEN circuit 200 does not need to amplify the bitline voltage, and a simple attenuator is sufficient according to example embodiments.

Under the above dynamic reference voltage scheme according to example embodiments, the sensing margin SM in equation (1b) can be re-written, by substituting equation (3), as $$(SM_X)_{DR} = |V_{bias} - A_V V_{BL,X} - V_{BL,X} - V_{OS}| \tag{1f}$$

From equation (1f), the mean and standard deviation of the sensing margin in the dynamic reference scheme according to an example embodiment result to $$(\mu_{SM,X})_{DR} = |\mu_{V_{bias}} - \mu_{V_{BL,X}} \cdot \mu_{A_V} - \mu_{V_{BL,X}}| \tag{1g}$$

$$(\sigma_{SM,X})_{DR} = \sqrt{\sigma_{V_{BL,X}}^2 \cdot (1 + \mu_{A_V})^2 + \sigma_{V_{OS}}^2 + \sigma_{V_{bias}}^2 + \mu_{V_{BL,X}}^2 \cdot \sigma_{A_V}^2} \tag{1h}$$

thus leading to the following variability of the sensing margin SM $$\left(\frac{\sigma_{SM}}{\mu_{SM}}\right)_{DR} = \frac{(\sigma_{SM,P} + \sigma_{SM,AP})_{DR}}{(1+\mu_{A_V}) \cdot (\mu_{V_{BL,AP}} - \mu_{V_{BL,P}})}. \quad (6)$$

Figure 1B:
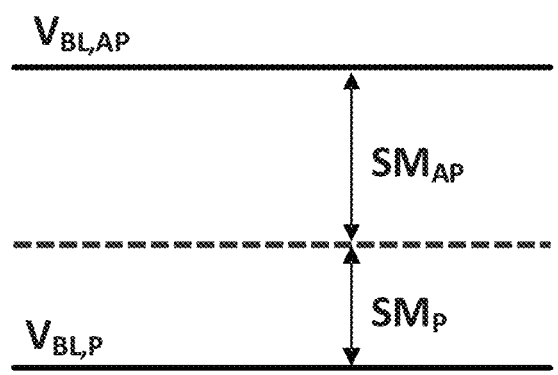
FIG. 1B shows a graph illustrating a fixed reference voltage operation for sensing.

Compared to the conventional scheme with $\mu_{V_{REF,AP}} = \mu_{V_{REF,P}}$ in equation (1e), the dynamic reference scheme according to example embodiments advantageously maintains the same nominal mean $\mu_{V_{BL,AP}}(\mu_{V_{BL,P}})$ and standard deviation $\sigma_{V_{BL,AP}}$ ($\sigma_{V_{BL,P}}$) of the bitline voltage as the conventional CVS, since the bitcell and the bitline are unaffected by REFGEN circuit 200 (compare FIGS. 1A and 2A). Due to the comparator 202 in FIG. 2A, its random offset voltage $V_{OS}$ and the variations in $V_{REF}$ add to the bitline voltage variations. Since all these additive contributions due to random variations are by definition uncorrelated, the overall standard deviation of the sensing margin of the DR scheme can be written as $$\sigma_{SM,X} = \sqrt{\sigma_{V_{BL,X}}^2 + \sigma_{V_{OS}}^2 + \sigma_{V_{REF}}^2} \cong$$
$$\sqrt{\sigma_{V_{BL,X}}^2 + \sigma_{V_{OS}}^2 + \sigma_{V_{bias}}^2} \quad (4)$$

where equation (3) was used, and it was assumed that $\mu_{A_V} \ll 1$ as discussed above, and $\sigma_{A_V}/\mu_{A_V} \ll \sigma_{V_{BL,X}}/\mu_{V_{BL,X}}$ (i.e., the variability in $A_V$ is lower than the bitline voltage variability). With reference to equation (6), for variability of the sensing margin SM, the DR scheme according to an example embodiment increases $\mu_{V_{BL,AP}} - \mu_{V_{BL,P}}$ at the denominator by a factor of $(1+\mu_{A_V})$, while slightly increasing the numerator due to the additional contribution $\sigma_{V_{bias}}^2$ in equation (4) due to REFGEN circuit 200, compared to CVS (see equation (1e)).

In other words, the DR scheme according to an example embodiments can potentially reduce the sensing margin variability (i.e., improve the BER in equation (2)) by a factor $(1+\mu_{A_V})$, assuming that REFGEN circuit 200 preferably introduces negligible variations compared to the bitline voltage variations. Quantitative analysis of such variability contributions according to an example embodiment will be provided below.

To compare equations (6) and (1b), one can evaluate their ratio assuming that REFGEN circuit 200 is sized to make the voltage gain variations small enough (i.e., $\mu^2_{V_{BL,X}} \cdot \sigma^2_{A_V}$ in equation (6) is negligible)

$$\frac{\left(\frac{\sigma_{SM}}{\mu_{SM}}\right)_{DR}}{\left(\frac{\sigma_{SM}}{\mu_{SM}}\right)_{CVS}} \approx \frac{\sqrt{\sigma^2_{V_{BL,X}} + \frac{\sigma^2_{V_{OS}} + \sigma^2_{V_{bias}}}{(1+\mu_{A_V})^2}}}{\sqrt{\sigma^2_{V_{BL,X}} + \sigma^2_{V_{OS}} + \mu^2_{V_{REF,X}}}}. \quad (8)$$

Figure 3:
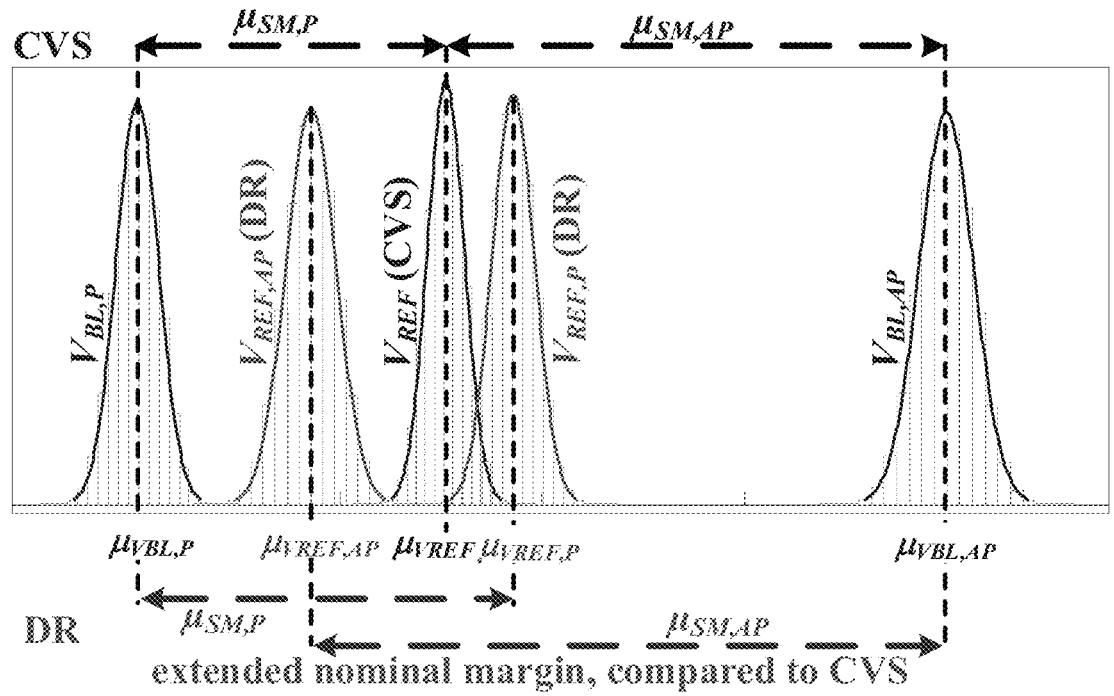
FIG. 3 shows an example of statistical distributions based on Monte Carlo simulations illustrating that the reference voltages are spread apart by the presence of the dynamic reference, according to an example embodiment, compared to a fixed reference voltage (i.e CVS).

From equation (8), the proposed dynamic reference scheme according to an example embodiment mitigates the impact of variations in the sense amplifier and the reference voltage, thus making the variability closer to its lower bound set by the bitcell variability in equation (1e). This is shown in the histogram from Monte Carlo simulations in FIG. 3 of the voltages determining the sensing margin. From the FIG. 3, the reference voltages are spread apart by the presence of the dynamic reference according to an example embodiment DR, compared to a fixed one (i.e CVS). More quantitatively, and as mentioned above, for practical bitline voltage swings $\mu_{V_{BL,AP}} - \mu_{V_{BL,P}}$ of 80-90 mV [5], an increase of very few tens of mV in the sensing margin typically corresponds to a significant sensing margin improvement by a few standard deviations. For example, 20 mV increase in $\mu_{V_{BL,AP}} - \mu_{V_{BL,P}}$ reduces the BER by 1.66 standard deviations from equation (2). Accordingly, from equation (3) values of AV lower than one are sufficient to achieve such significant improvement. Hence, the REFGEN circuit according to example embodiments described below was implemented as an attenuator, by way of example, not limitation. As main constraint in the circuit design of REFGEN circuits according to example embodiments, its contributions to the variability in equation (1d) (i.e., $\sigma^2_{V_{bias}} + \mu^2_{V_{BL,X}} \cdot \sigma^2_{A_V}$) is preferably made smaller than other variation contributions, to advantageously enable the above advantage.

Reference Generator Circuit Considerations According to Example Embodiments

Theoretically, according to embodiments of the present invention, any attenuator, that fits the characteristics of input and output signal can serve as the REFGEN circuit. In other words, the solutions are not limited to any particular implementation. In the following, a simple implementation of a REFGEN attenuator as the pseudo-pMOS inverter circuit 400 according to an example embodiment is described (see FIG. 4A). In that circuit 400, transistor M1 controls $V_{REF}$, M2 is its active load, M3 is a switch that turns off M1 when the REFGEN enable signal is deasserted, and M4 connects the bitline voltage to M1 when the enable is asserted. If one considers the transistor saturation current, which linearly depends on the gate overdrive in reasonably recent technologies [3], [5] according to $K \cdot (V_{GS} - V_{TH0} + \lambda_{DIBL} V_{DS})$, where K is the transistor strength, $V_{GS}$ and $V_{DS}$ are the gate-source and drain-source voltages, $\lambda_{DIBL}$ is the transistor DIBL coefficient, and $V_{TH0}$ the intrinsic threshold voltage, analysis of FIG. 4A and comparison with equation (1) yields $$V_{bias} = \frac{PNR((\lambda_{DIBL}+1) \cdot V_{DD} - V_{TH0}) - (V_{TUN} - V_{TH0})}{(PNR+1)\lambda_{DIBL}} \quad (9)$$

$$A_V = \frac{PNR}{\lambda_{DIBL}(1+PNR)} \quad (10)$$

where $PNR = K_{M1}/K_{M2}$ is the strength ratio of M1 and M2 and voltage $V_{TUN}$ is adjusted to tune the driver strength of M2, as discussed below. From equation (9)-(10), both $V_{bias}$ and $A_V$ are set by the strength ratio PNR. According to an example embodiment, at nominal process corner, the PNR is simply set by appropriately sizing the ratio between the channel width of M1 and M2, and setting $V_{TUN} = V_{DD}$ in FIG. 4A. To compensate die-to-die variations, $V_{TUN}$ is adjusted at testing time to obtain the desired PNR at the chip-specific process corner, according to an example embodiment.

Figure 4A:
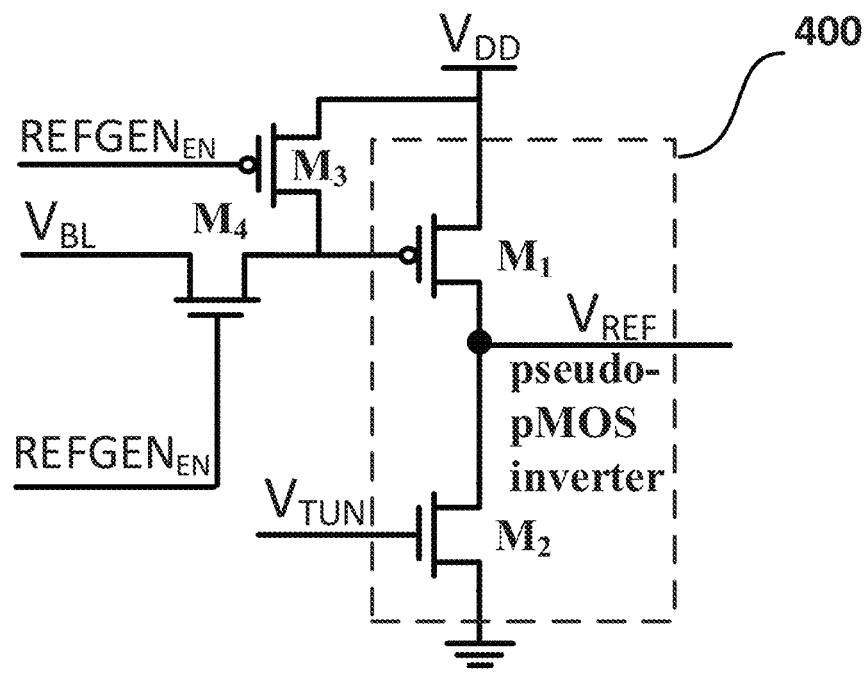
FIG. 4A shows a circuit diagram of an implementation of a dynamic reference generator in the form of an attenuator as a pseudo-pMOS inverter circuit, according to an example embodiment.
Figure 4B:
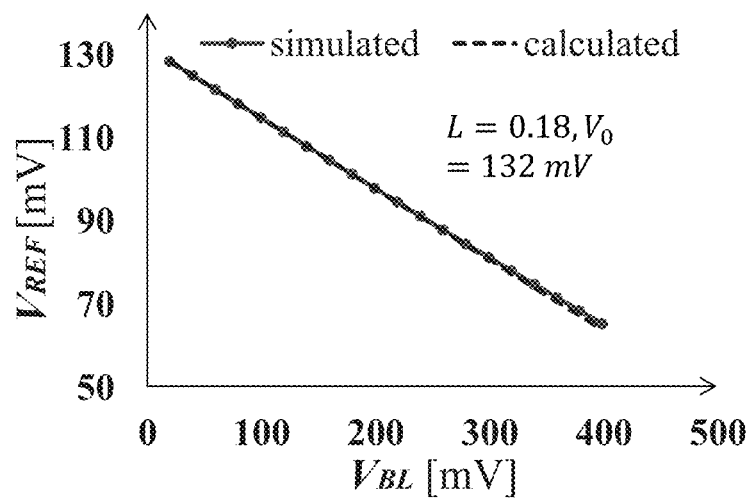
FIG. 4B shows a graph illustrating calculated and simulated DC characteristics of a dynamic reference generator circuit according to an example embodiment.
Figure 5:
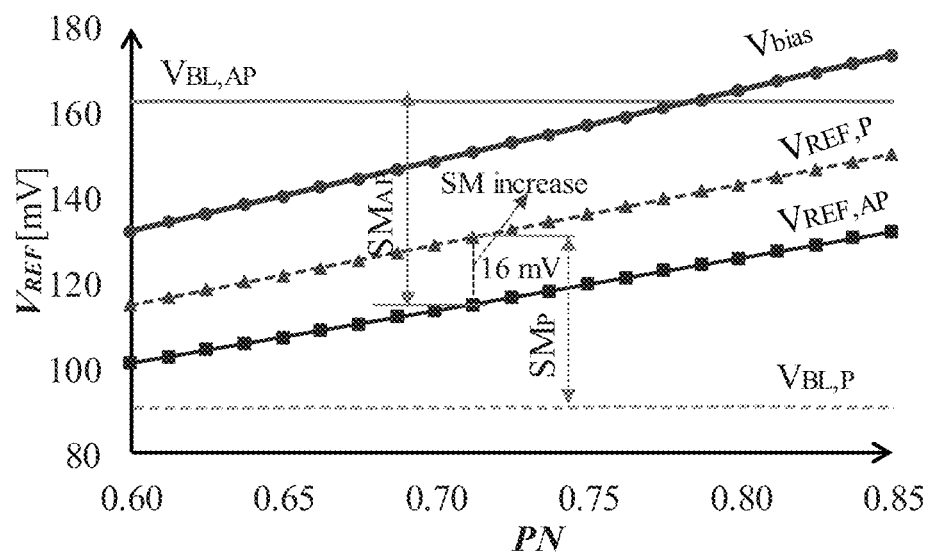
FIG. 5 shows a graph illustrating the reference voltage generated by a dynamic reference generator circuit according to example embodiments in AP and P state (i.e., when the bitline voltage is respectively $V_{BL,P}=158$ mV and $V_{BL,P}=84$ mV) versus the PN-ratio.

The above assumptions and models were extensively validated through circuit simulations in 65 nm CMOS. For example, the good linearity of the input-output characteristics of the REFGEN circuit 400 according to an example embodiment in equation (1) is shown in FIG. 4B for $A_V = 0.18$ and $V_{bias} = 132$ mV. FIG. 4B shows that the model in equation (1) fits simulations well, with the average (maximum) error being 0.4% (2.5%). FIG. 5 shows the reference voltage generated by REFGEN circuit 400 (FIG. 4A) in AP and P state (i.e., when the bitline voltage is respectively $V_{BL,P} = 158$ mV and $V_{BL,P} = 84$ mV) versus the PN-ratio. As expected, the reference voltage in P is larger than in AP, and their difference varies from 10 mV to 19 mV, depending on the PNR ranging from 0.6 to 1. In such range, the voltage gain $A_V$ of the REFGEN circuit 400 is well in line with the practical values discussed in the previous Section, being $A_V$ in the range of 0.1-0.25. Regarding $V_{bias}$, simulations showed (see FIG. 5) that $V_{bias}$ essentially depends linearly on the PN-ratio. The impact of the REFGEN circuit 400 on the read robustness is investigated by statistical analysis in the subsequent section.

Evaluation of Dynamic Reference Scheme According to Example Embodiments

Extensive Monte Carlo simulations were run to statistically evaluate the benefits brought by the proposed DR scheme according to example embodiments in terms of read robustness. Post-layout simulations of an STT-MRAM 512×512 array with architecture as in [3], [5] were performed. A commercial 65 nm design kit was augmented with the known macroscopic MTJ model in [21]. The MTJ size and the oxide thickness were respectively set to 120 nm×60 nm and 1.15 nm [5]. Regarding the variations, CMOS transistor models from the same design kit were used. The MTJ area and thickness were assumed to be Gaussian distributed, resulting to 5% resistance variability, which is consistent with experimental results in [22], [23]. For sense amplifier topology, the current-controlled latch topology in [24] was adopted, sizing its transistors to achieve an offset of 5 mV according to an example embodiment. The impact of design parameters according to example embodiments on the performance and BER are discussed in the following.

Figure 6:
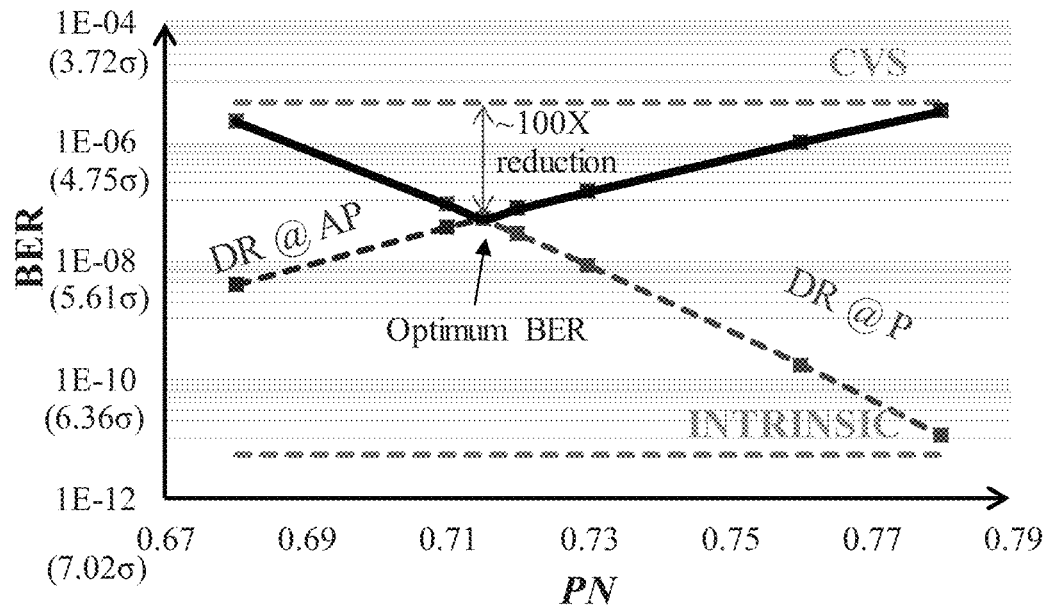
FIG. 6 shows a graph illustrating the BER from Monte Carlo simulations for read at nominal voltage under the PNR range of interest, according to example embodiments.

The sensitivity of the BER to the PNR in the DR was first examined, and the benefits with respect to the conventional CVS scheme. FIG. 6 shows the BER from Monte Carlo simulations for read at nominal voltage under the PNR range of interest. In FIG. 6, the size of M1 is varied and M2 is kept fixed (compare circuit 400 shown in FIG. 4A), with a width of 12× the minimum transistor. The length of $M_1$ and $M_2$ is 2× the minimum length. From FIG. 6, the BER is reduced when the PNR is increased in P state, due to the increase in $V_{REF,P}$ (see FIG. 5) and hence the corresponding sensing margin in P in FIG. 2B.

An opposite trend is observed for AP. Since the BER is defined by the worst-case (i.e., largest) value between AP and P state, the optimum PNR that minimizes the BER is the value that makes the BER in AP and P the same. In this particular case for an example embodiment, the optimum BER with DR design is achieved with PNR equal to 0.8, which improves the BER by ~100× as indicated in FIG. 5, compared to the conventional CVS scheme.

Equivalently, the proposed DR scheme improves the read yield by 1.1 standard deviations $\sigma^{SM}$. Under the sizing defined by the optimal PNR, the area of the REFGEN is ~0.2% of the bitcell array area, leading to an overall readout circuit area (i.e., sense amplifier and REFGEN) of 2% in an array with 16:1 column multiplexing (i.e., 512/16=32 replicas of REFGEN, whose area is halved when sharing them between adjacent banks). In other words, the proposed DR scheme according to an example embodiment brings a remarkable improvement in the read robustness, at moderate area cost.

Figure 7:
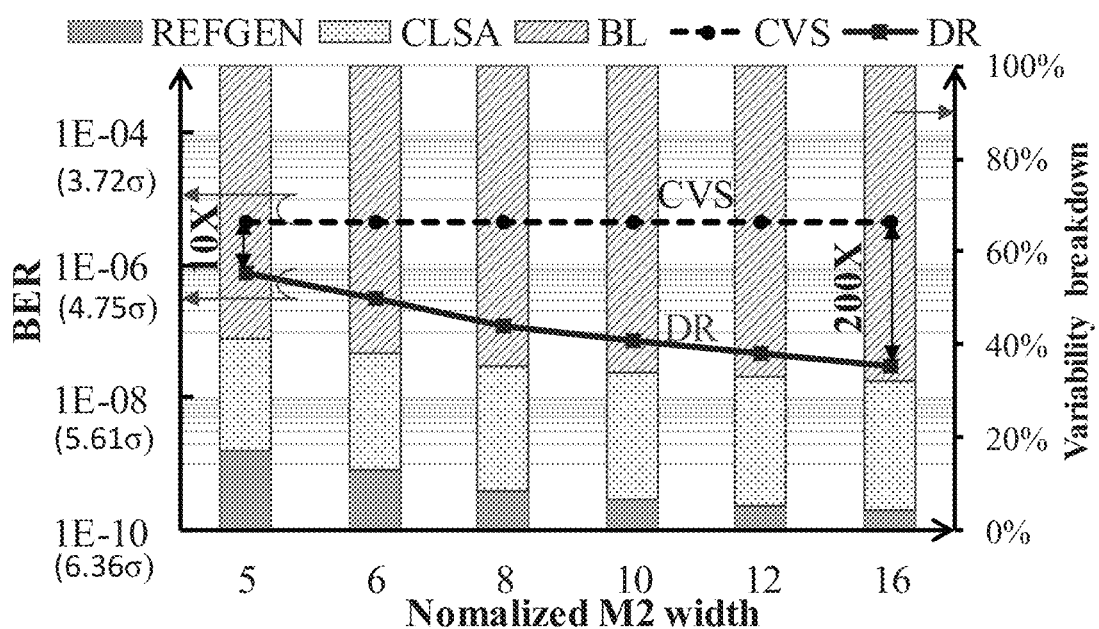
FIG. 7 shows the trend of the BER and the variability breakdown versus the size of $M_2$ in the dynamic reference generator circuit of FIG. 4A, under P state, according to example embodiments.

The above analysis has explored the optimization of the PNR to drastically reduce the BER of DR according to an example embodiment compared to CVS scheme, assuming a fixed size for $M_2$. It is noted that the size of $M_2$ is another parameter that can be used to further reduce the BER in the DR scheme according to different embodiments, as larger size entails smaller random variations in $V_{bias}$ and $A_V$, from the Pelgrom's law [27]. To quantify the impact of the size of M2, in the following the PNR is set at the above discussed optimal value. FIG. 7 shows the trend of the BER and the variability breakdown versus the size of $M_2$, under P state. In FIG. 7, the DR scheme according to example embodiments is able to significantly reduce the BER even at small sizes of $M_2$ (e.g., 4× the minimum), compared to the conventional CVS scheme. This confirms that the variability improvement by (1+$\mu_{A_V}$) in the denominator of equation (6) is larger than the degradation in the numerator ($\sigma_{SM,P}$+$\sigma_{SM,AP}$) for practical transistor sizes. However, this does not mean that the variations introduced by the REFGEN circuits according to example embodiments in terms of $V_{bias}$ and $A_V$ are totally negligible. FIG. 7 shows that the percentage contribution of the variations of the REFGEN circuits according to example embodiments to the overall read margin variability in equation (6) can be steadily reduced by increasing the size of $M_2$, with a benefit proportional to square root of the transistor channel area according to the Pelgrom's model [27]. As a result, the proposed DR scheme according to example embodiments is able to further reduce the BER compared to the conventional CVS scheme. It is noted that enlarging M2 beyond a certain extent provides diminishing returns, as the REFGEN circuit variability contribution becomes small. This justifies the above choice of 12× size for M2 according to an example embodiment, which provides a ~100× improvement in BER. Nevertheless, from FIG. 7 tighter BER constraints can be met in different embodiments by bearing the area cost of larger REFGEN circuits, with BER reduction up to three orders of magnitude.

Compared to CVS, the DR scheme according to example embodiments can introduce some performance penalty, due to the additional delay of the REFGEN circuit in generating the reference voltage once the bitline voltage has settled. However, the REFGEN delay according to example embodiments has been found to be always less than 10% of the CVS access time, and is hence reasonably small compared to the large BER improvement. Indeed, the REFGEN circuit according to an example embodiment has a delay that is comparable to an inverter gate delay, whereas the time to develop the bitline voltage is known to be much larger [6].

The presence of REFGEN circuits according to example embodiments can also introduce an energy overhead that increases when increasing the size of M1 and M2. Simulations show that such energy overhead is expected to be always lower than 20% for M2 sizing in the range of 12×-16× the minimum size, which brings a 400-800× BER improvement according to example embodiments.

The impact of Supply Voltage and Energy Consumption will now be described. The above analysis was extended to the 0.75-1.2 V voltage range, which is very wide for STT-MRAMs [3]. Lowering the supply voltage leads to an increase in the access transistor on-resistance, and hence the bitcell resistance [5]. In CVS, this leads to an increase in $V_{BL}$, which hence requires an increase in $V_{REF}$ to be well centered between the high and the low bitline voltage, and minimize the BER. Similarly, in the DR scheme according to example embodiments, Vbias is preferably increased to achieve the optimal BER as in equation (6), as enabled by tuning $V_{TUN}$ in FIG. 4A.

Figure 8:
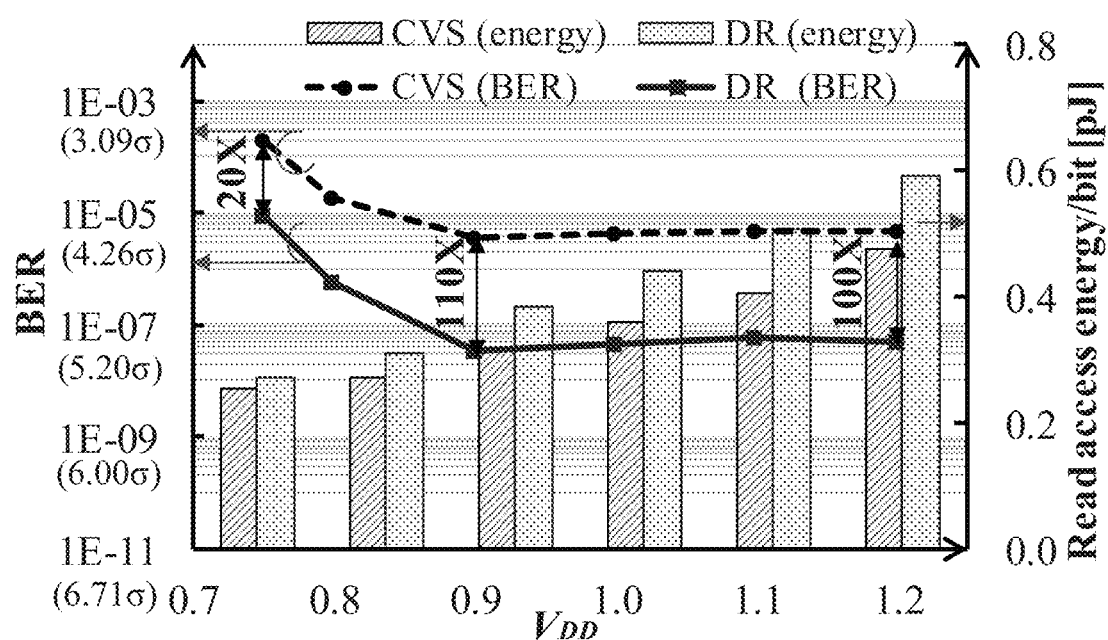
FIG. 8 shows a graph illustrating comparative read energy and BER versus $V_{DD}$ for DR scheme according to example embodiments and CVS scheme.

The resulting energy and BER are plotted in FIG. 8 versus $V_{DD}$. From FIG. 8, the read energy of DR scheme according to example embodiments and CVS scheme is reduced by ⊡ 1.9× at 0.75 V compared to nominal voltage, thus confirming the effectiveness of voltage scaling. Also from FIG. 8, the BER of CVS becomes monotonically worse at lower voltages, as expected from the larger sensitivity of the bitcell access transistor to random variations. On the other hand, from FIG. 8, the BER of the DR scheme according to example embodiments actually improves at moderately low voltages, before becoming worse at very low voltages. Quantitatively, the BER at 0.9-1.1 V is up to 3-4× better than at nominal voltage. At voltages lower than 0.9 V, the BER of the DR scheme according to example embodiments degrades monotonically as in CVS. This non-monotonic behavior of the BER in the DR scheme according to example embodiments is due to the interaction of various effects. Firstly, operation at lower voltages increases the bitcell access transistor resistance, thus leading to an increase in both the low ($V_{BL,P}$) and high ($V_{BL,AP}$) bitline voltage level, as $I_{read}$ is kept the same. In turn, $V_{bias}$ in the REFGEN circuit according to an example embodiment is preferably increased to be reasonably centered between $V_{BL,P}$ and $V_{BL,AP}$. The resulting increase in $V_{BL,AP}$-$V_{BL,P}$ and increase in Av lead to a larger $V_{REF,P}$-$V_{REF,AP}$ and hence a larger sensing margin from equations (3) and (1f). In the above considered design according to an example embodiment, $V_{REF,P}$-$V_{REF,AP}$ is increased from 16 mV to 38 mV when $V_{DD}$ is scaled from 1.2 V down to 0.75 V, assuming $I_{read}$=50 µA. Secondly, the sense amplifier offset voltage is slightly reduced at lower voltages [20]. In the adopted technology used in an example embodiment, a slight reduction of the offset from 5 mV down to 4 mV was observed when reducing $V_{DD}$ from 1.2 V down to 0.75 V. Thirdly, operation at lower voltages increases the bitcell access transistor sensitivity to variations as in CVS. From FIG. 8, the first two effects dominate over the third one in the 0.9-1.2 V range, thus improving the BER compared to nominal voltage. The latter dominates at lower voltages, thus determining a BER degradation at $V_{DD}$<0.9 V.

Regarding the comparison of the DR scheme according to example embodiments and CVS scheme, FIG. 8 shows the superiority of the DR sensing scheme over CVS in terms of BER, with a sensing margin improvement by 100-110× in the 0.9-1.2 V range, which corresponds to 0.9-1.0 standard deviations. Such improvement is reduced to 20× at 0.8 V. The DR scheme according to example embodiments consumes 7% (25%) higher energy per read access at 0.75 V (1.2 V) compared to CVS, leading to an energy per access of 0.25 pJ (0.59 pJ) as shown in FIG. 8.

In short, the proposed DR scheme according to example embodiments offers a substantial improvement in the read robustness of STT-MRAMs at minor energy and delay penalty, compared to conventional voltage sensing schemes. Also, the energy consumption of the DR scheme according to example embodiments significantly benefits from voltage scaling, being based on voltage sensing.

Joint Dynamic Reference and BVS According to Example Embodiments

Figure 9:
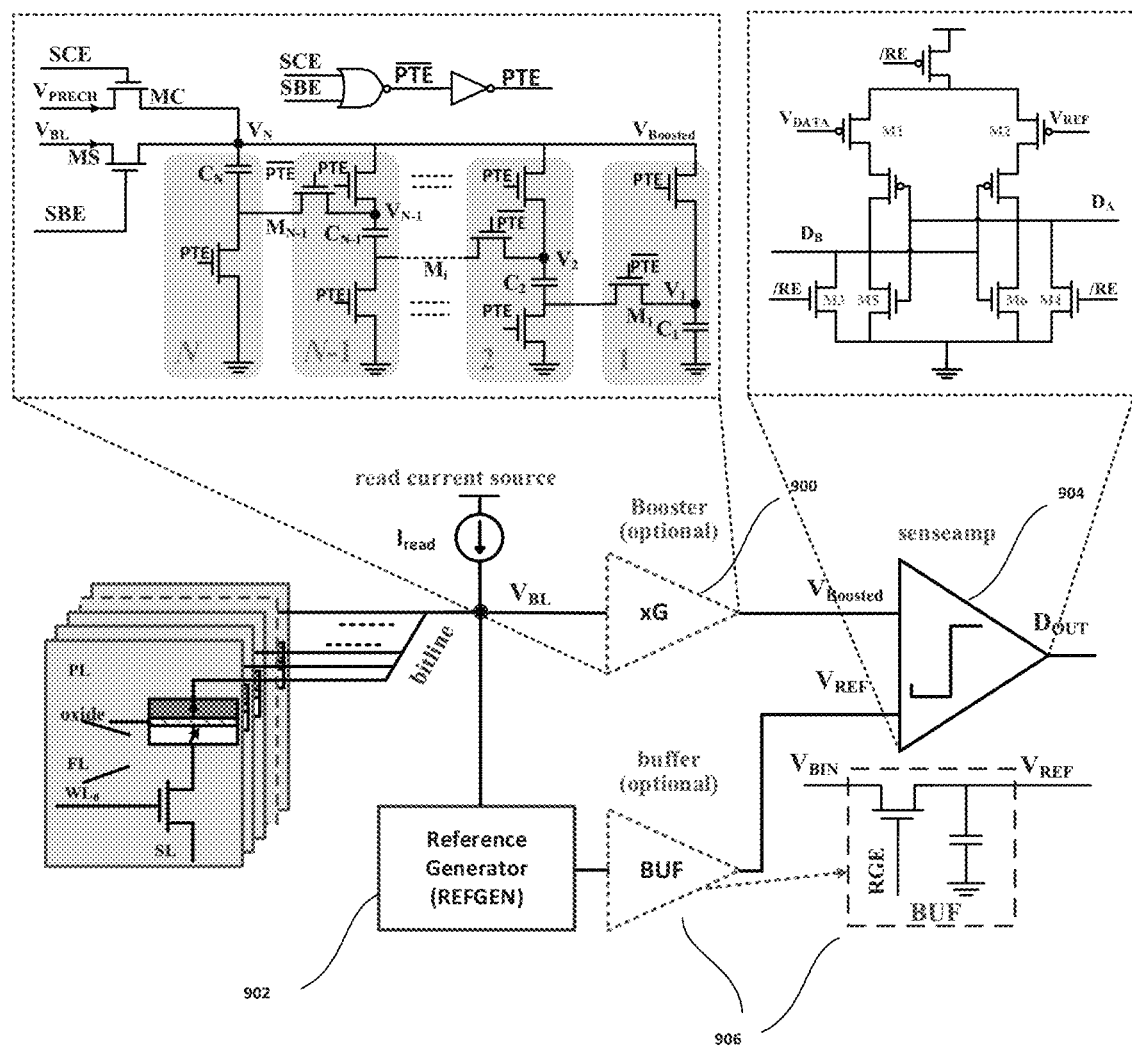
FIG. 9 shows a schematic drawing illustrating a memory bitcell consisting of Magnetic Tunnel Junction (MTJ) driven by an access transistor and with a circuit for generating a dynamic reference voltage for sensing combined with BVS, according to an example embodiment.

In the following the joint application of the dynamic reference and an existing technique to enhance the BER according to example embodiments is considered, to exemplify the DR scheme capability of being synergistic with other techniques according to various embodiments. In particular, the boosted bitline sensing scheme (BVS) proposed by the authors in [5] is here considered as a case study according to an example embodiment, in view of BVS's effectiveness in improving the robustness and its low overhead. In BVS, the bitline voltage is boosted by a factor G>1 as shown in FIG. 9

$$V_{Boosted,X} = G \cdot V_{BL,X} \quad (11)$$

By replacing $V_{BL}$ with its boosted version VBoosted,X of equation (11), and repeating the derivation described above leading to equation (6), the variability of the sensing margin under joint dynamic reference and BVS according to an example embodiment is $$\left(\frac{\sigma_{SM}}{\mu_{SM}}\right)_{DR+BVS} = \frac{(\sigma_{SM,P} + \sigma_{SM,AP})_{DR+BVS}}{(G + \mu_{A_V}) \cdot (\mu_{V_{BL,AP}} - \mu_{V_{BL,P}})} \quad (12)$$

From equation (12), the actual sensing margin after the booster 900 and the REFGEN circuit 902 is significantly magnified by a factor of (G+$\mu_{A_V}$). Similarly, to equation (8), the ratio between the variability of this joint scheme according to an example embodiments and the conventional CVS is readily found to be $$\frac{\left(\frac{\sigma_{SM}}{\mu_{SM}}\right)_{DR+BVS}}{\left(\frac{\sigma_{SM}}{\mu_{SM}}\right)_{CVS}} \approx \frac{\sqrt{\sigma_{V_{BL,X}}^2 + \frac{\sigma_{V_{OS}}^2 + \sigma_{V_{bias}}^2}{(G + \mu_{A_V})^2}}}{\sqrt{\sigma_{V_{BL,X}}^2 + \sigma_{V_{OS}}^2 + \mu_{V_{REF,X}}^2}}. \quad (13)$$

which was obtained by assuming that the dynamic reference is again designed and sized to maintain its variability contributions $\sigma^2_{AV} \cdot \mu^2_{VBL,X}$ negligible.

From equation (13), the joint DR and BVS scheme according to an example embodiment is able to mitigate the impact of variations in the sense amplifier 904 and the reference generator circuit 902, compared to CVS. Comparing equations (8) and (13), the DR scheme provides further robustness improvements, compared to standalone BVS, being G added to µAV.

Benefits of Dynamic Reference Under Joint Adoption with BVS According to Example Embodiments Circuit considerations and timing in relation to dynamic reference under joint adoption with BVS according to example embodiments will be described next, highlighting the capability of the DR scheme according to example embodiments to be synergistic with assist techniques that improve the read robustness by manipulating the bitline voltage (e.g., [5], [21]). As a case study, the boosted bitline sensing scheme (BVS) in [5] is considered, which was recently proposed as a low overhead technique to improve the read BER.

The schematic of the joint DR and BVS scheme according to an example embodiment is shown in FIG. 9, where the optional booster (xG) 900 and an optional analog buffer (BUF) 906 are both used. BUF 906 consists of a capacitor and an NMOS pass transistor, which are used to sample and hold the REFGEN circuit 902 output voltage. The booster xG 900 is a switched capacitor voltage booster as in [5]. The booster xG 900 implemented here as an N-th order booster using N equal capacitors [28], which are first connected in parallel and fully charged to the bitline voltage level $V_{BL}$, and are then switched to series connection to multiply it by the voltage ratio G. Although G is theoretically equal to N, practical values of G are lower due to the capacitive parasitic of transistors and capacitors [5]. Apart from boosting up $V_{BL}$, the booster xG 900 also serves as a buffer storing the final bitline voltage, so that the bitcell can be turned off during the sensing phase to save energy [5]. In contrast, CVS and the standalone DR according to example embodiments keep the bitcell (and REFGEN circuit for standalone DR according to example embodiments) active during the sensing phase.

In the joint DR and BVS scheme according to an example embodiment (FIG. 9), the reference voltage is derived from the bitline as in equation (3). Hence, to preserve the ability to shut down the bitcell during sensing and boosting phases, the analog capacitive buffer BUF 906 is added to hold the final bitline voltage during the entire sensing phase.

Figure 10A:
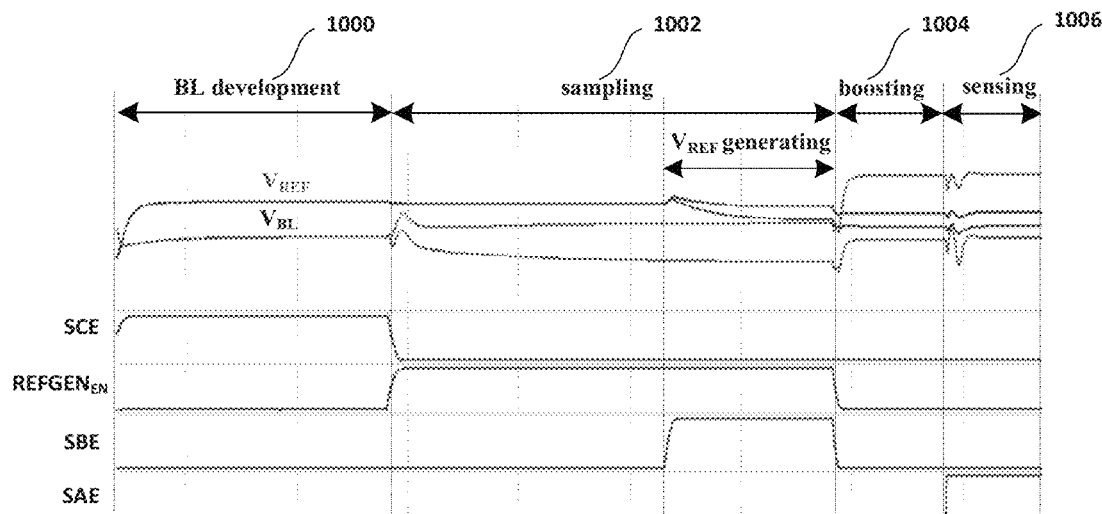
FIG. 10A shows the timing in the joint dynamic reference voltage and BVS scheme according to an example embodiment.

The timing in the above joint scheme according to an example embodiment is shown in FIG. 10A, where the sensing operation consists of four phases. In the first phase 1000 (bitline development), $V_{BL}$ is charged to the voltage pertaining to the MTJ state. At the same time, the booster and buffer capacitors are precharged to the intermediate value $(V_{BL,P}+V_{BL,AP})/2$ by asserting the switched-cap enable (SCE)[5], so that the subsequent transient towards either $V_{BL,P}$ or $V_{BL,AP}$ is equally fast. In the second phase 1002 (sampling), $V_{BL}$ is sampled into the booster capacitors by asserting reference generator enable (REFGEN$_{EN}$), which enables the REFGEN by turning on M4 (FIG. 4A). Towards the end of the sampling phase 1002, the output of REFGEN circuit $V_{REF}$ is sampled by the buffer by asserting the switched-cap buffer enable (RGE). This transient is typically much faster than sampling $V_{BL}$ in the booster, as the buffer capacitor is much smaller than the total booster capacitance. Hence, the REFGEN circuit operation is fully overlapped with the booster operation, thus it does not require any extra delay for the REFGEN circuit. In the third phase 1004 (boosting), the REFGEN circuit and the bitcell are turned off to save their energy. At the same time, RGE is de-asserted to disconnect the bitline voltage from M1 (FIG. 4A) in the REFGEN circuit, RGE is de-asserted to hold the sampled $V_{REF}$, and the bitline voltage is boosted [6]. In the fourth phase 1006 (sensing), the sense amplifier 904 is enabled by asserting the sense amplifier enable (SAE), and senses the difference between $V_{boosted}$ and $V_{REF}$ to complete the readout.

Figure 10B:
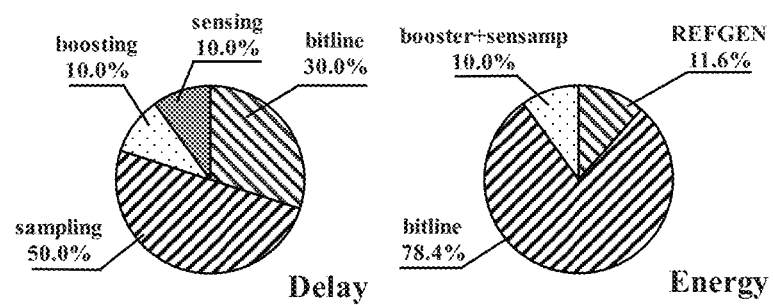
FIG. 10B shows energy and delay breakdown in the joint dynamic reference voltage and BVS scheme according to an example embodiment.

Considering a 512×512 STT-MRAMs array with 1:16 column multiplexing as a representative example, under the adopted 65-nm technology according to an example embodiment, the resulting access time is 5 ns, and its breakdown is shown in FIG. 10B. The booster sampling takes 50% of the read access time, and another 30% is taken by the bitline voltage development. While the REFGEN circuit is active for 22% of the time, this is overlapped with the booster sampling 50% of the time and thus not shown in FIG. 10B (i.e., no extra delay overhead compared to BVS). Another 10% of the access time is taken by boosting, and a subsequent 10% is occupied by the actual sensing through the sense amplifier. The read access energy of the array with joint DR and BVS according to an example embodiment is ≈0.56 pJ at 1.2 V. Interestingly, the energy in the joint DR and BVS according to an example embodiment is actually 6% lower than standalone DR according to an example embodiment, due to the adoption of the buffers in BUF and the booster, as they allow to switch off $I_{read}$ and the REFGEN circuit as discussed above. The energy in the joint DR and BVS according to an example embodiment is dominated by the bitcell energy (78.4%) as expected, due to the constant read current drawn while developing the bitline voltage. The remaining energy is mostly due to the REFGEN circuit (11.6%), booster precharging (0.2%), and sense amplifier (9.8%). Accordingly, the energy of the joint DR and BVS scheme according to an example embodiment is ≈18% larger than the standalone BVS scheme.

Design considerations on the booster gain will be described next. The choice of the voltage gain in the booster has various effects. From equation (12), larger booster gains (G) improve the BER and amplify the bitline voltage to a higher level, thus a larger $V_{REF}$ is used to keep it well centered within the bitline voltage swing. In turn, from equation (10) this translates into a larger PN as the width of $M_1$ (FIG. 4A) is increased relative to $M_2$ (FIG. 4A), which increases the gain AV of the REFGEN circuit, and hence further improves BER. From a design viewpoint, the booster gain is set by the booster order and the capacitor area. To gain an insight into such dependence, the BER of CVS scheme, BVS scheme and joint DR/BVS scheme (which includes standalone DR scheme when no booster is utilized) according to example embodiments is plotted in FIG. 11 in two different cases. In the first one, the BER is evaluated at same capacitor size (6 μm², which corresponds to 70 fF at 1.2 V) and different booster order, whereas in the second one the capacitor size is varied from two to eight times a base 23 fF capacitance, while keeping the same booster order of two. The above unit capacitor size occupies a reasonable area that is equivalent to ≈2 STT-MRAM bitcells of the corresponding array column (i.e., ≈0.3% of the area of the array organization described above).

Figure 11:
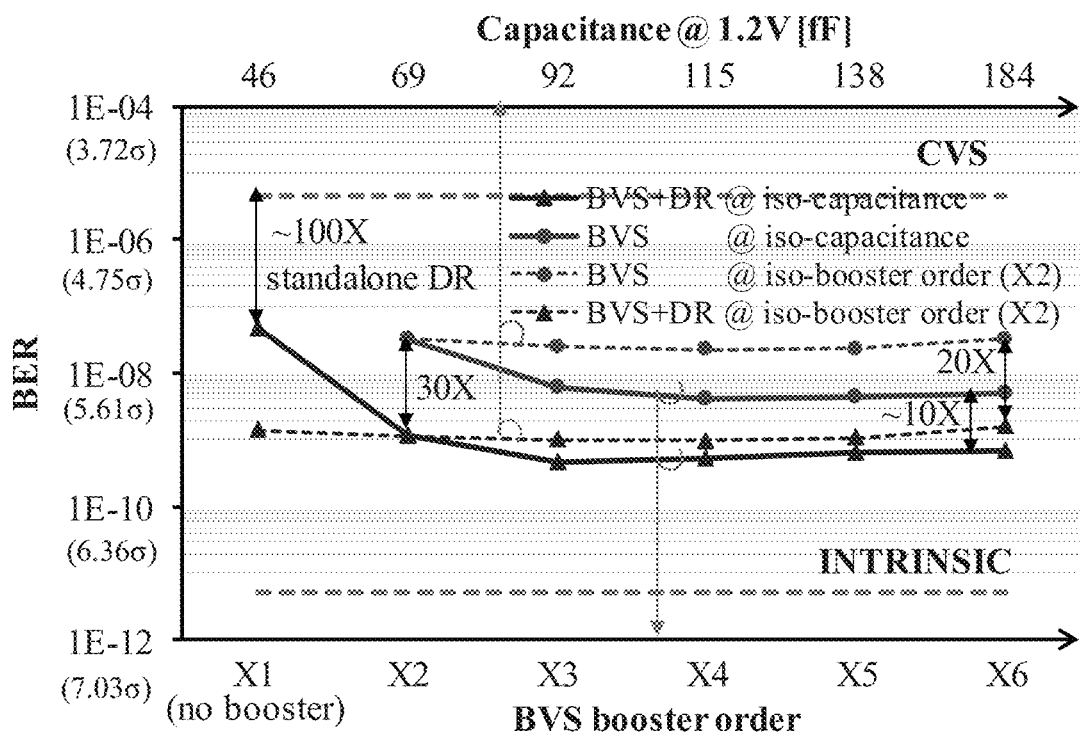
FIG. 11 shows a graph illustrating the BER of CVS scheme, BVS scheme and joint DR/BVS schemes (which includes standalone DR scheme when no booster is utilized) according to example embodiments evaluated, in a first case, at same capacitor size (6 μm2, which corresponds to 70 fF at 1.2 V) and different booster order, and in a second case at the same booster order of two with capacitor size from two to eight times a base 23 fF capacitance.

From FIG. 11, the standalone DR scheme improves the BER by two orders of magnitude (no booster is utilized, as labeled by X1 in the x-axis). When the booster is employed, standalone BVS improves the BER by two orders of magnitude at same capacitor area over CVS, which is in line with [5]. Such improvement increases to four orders of magnitude when the capacitor area is further increased, at the cost of larger area.

The introduction of the DR scheme in addition to BVS according to example embodiments provides a further 10-40× BER improvement compared to standalone BVS at iso-capacitance (i.e., iso-area). It is worth noting that such BER improvement weakly depends on the booster order, since its actual voltage gain G remains relatively constant in spite of the increased order. This is due to the stronger effect of transistor and capacitor parasitics, since each of the G booster capacitors becomes smaller, since the overall capacitor area is being kept constant [5]. More quantitatively, G was found to range from 1.4 to 1.82, when the booster order ranges from X2 to X6, when keeping the capacitance at 70 fF.

When larger capacitance and area are allowed, the joint adoption of DR and BVS according to example embodiments provides further BER reduction. This is due to the larger voltage gain allowed by the improved mitigation of parasitic effects, due to the adoption of larger (and hence more dominant) capacitor [5]. From FIG. 11, the adoption of a capacitance that is four times larger than the unit capacitance of 70 fF makes the voltage gain G equal to 1.82 which is closer to the value of two that would be ideally provided by an X2 booster. As a result, the joint DR and BVS scheme according to an example embodiment enables a 20× BER improvement compared to standalone BVS.

Iso-area comparison with CVS will now be described, specifically the joint DR and BVS scheme according to example embodiments was also compared to CVS designed for the same area target. Accordingly, the area of the readout circuitry (i.e., xG, REFGEN circuit, buffer and sense amplifier) in the joint DR and BVS scheme according to an example embodiment was kept the same as sense amplifier area in CVS. The total readout circuit area target is set to the two typical values of 2-2.5% of the array area [5], while keeping the same read current of 50 µA to fairly compare at the iso-read disturbance.

From the circuit layout in the adopted 65 nm technology according to example embodiments, the readout circuit area is dominated by the booster, which occupies 1.41% (0.91%) of the overall array area under 2.5% (2%) area target. The remaining area is occupied by the sense amplifier (0.69%), buffer (0.25%) and REFGEN circuit (0.15%). In other words, the introduction of the proposed DR scheme according to example embodiments has a minor impact on the overall area of the joint DR and BVS scheme, as the additional REFGEN circuit leads to a negligible area penalty. On the other hand, the area available for the sense amplifier in CVS and standalone DR according to example embodiments is larger than the joint DR and BVS scheme according to example embodiments, since it can occupy the entire readout circuitry area (considering that the REFGEN circuit area is negligible, as mentioned above), due to the absence of the booster. As a result, the sense amplifier offset in CVS and standalone DR according to example embodiments is preferably reduced to 3 mV, which is smaller than the 5 mV value encountered in joint DR and BVS scheme according to example embodiments.

Figure 12:
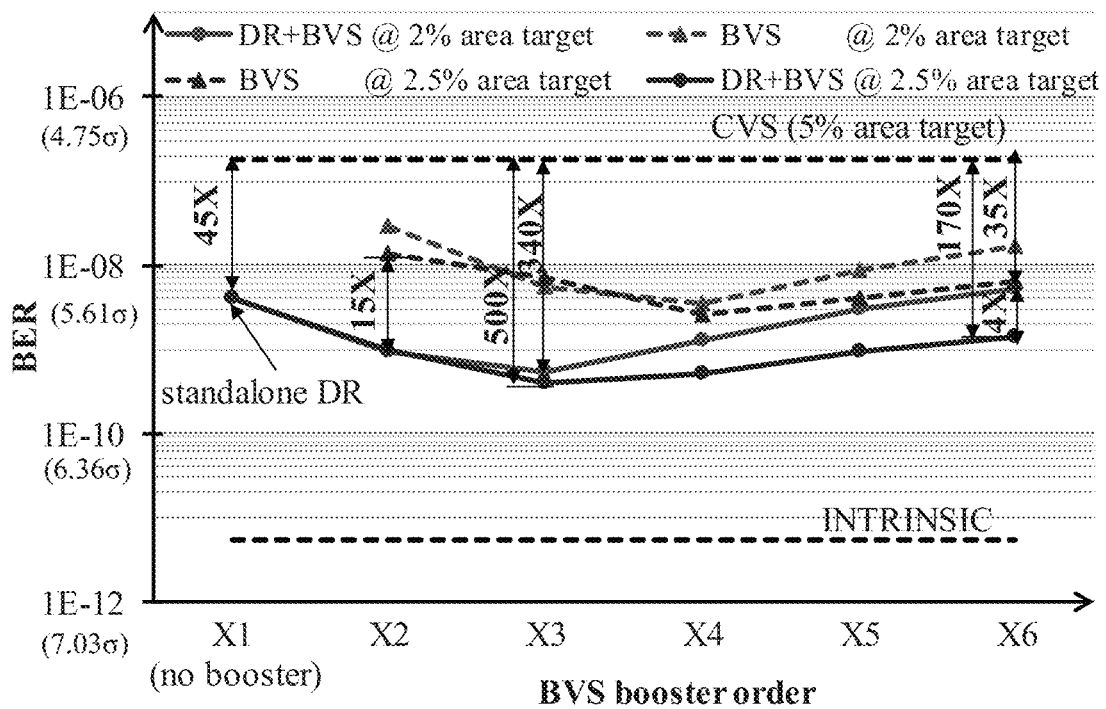
FIG. 12 shows a graph illustrating BER of the joint DR and BVS scheme according to example embodiments (including standalone DR if no booster is used, X1 on x-axis) under the 2.5% area target and 2.0% area target compared to CVS.

Monte Carlo simulation results are presented in FIG. 12 for different schemes. From FIG. 12, the joint DR and BVS scheme according to example embodiments (including standalone DR if no booster is used, X1 on the x-axis) under the 2.5% area target provides a consistent 4-15× BER improvement compared to BVS, across different booster order values. Compared to CVS, the joint DR and BVS scheme according to example embodiments improves the BER by 170-500× (see FIG. 12 for X2 ... X6 on the x-axis). Smaller improvements were observed for 2% readout circuitry area target, and the achieved BER is worse than the 2.5% area target, as expected from the more limited area available for the booster, which leads to a lower voltage gain G (see above discussion of gain dependence of BER). In particular, the joint DR and BVS scheme according to an example embodiment under 2% budget provides a 3-30× (35-340×) BER improvement compared to BVS (CVS).

In absolute terms, the joint DR and BVS scheme according to example embodiments can achieve a rather good BER in the order of $10^{-8}$-$10^{-10}$ under 2-2.5% area target, corresponding to a read sensing margin of 5.61-6.36 standard deviations. In particular, the BER was found to be non-monotonic with booster order, with the minimum occurring under X3 booster according to an example embodiment. This non-monotonic behavior is due to the fact that an increase in the booster order ideally improves the voltage gain G as observed for X2 and X3 boosters. However, larger values of G at iso-area reduce the individual booster capacitors to the extent that the actual voltage gain G is lower than X3 booster, due to the degradation imposed by the parasitics. Overall, the typical BER target of $10^{-9}$ ($5 \cdot 10^{-10}$) is achieved with X2 (or X3) booster with readout area cost of 2% (2.5%) of array area, according to example embodiments.

Interestingly, results show that the DR scheme according to example embodiments is synergistic with BVS, as the BER in the order of $10^{-9}$ is achieved with only 2% readout circuitry area budget. This is explained by the above observation that the bitline boosting uses larger $V_{REF}$ and hence PN, which in turn leads to a larger REFGEN circuit gain AV and reference difference $V_{BL,AP}$-$V_{BL,P}$. In particular, the latter increases from ≈16 mV in standalone DR according to an example embodiment to ≈30 mV in joint DR and BVS scheme according to an example embodiment, when an X3 booster is used along with a 60-fF capacitor, achieving G=1.72 at 1.2 V according to an example embodiment.

Figure 13A:
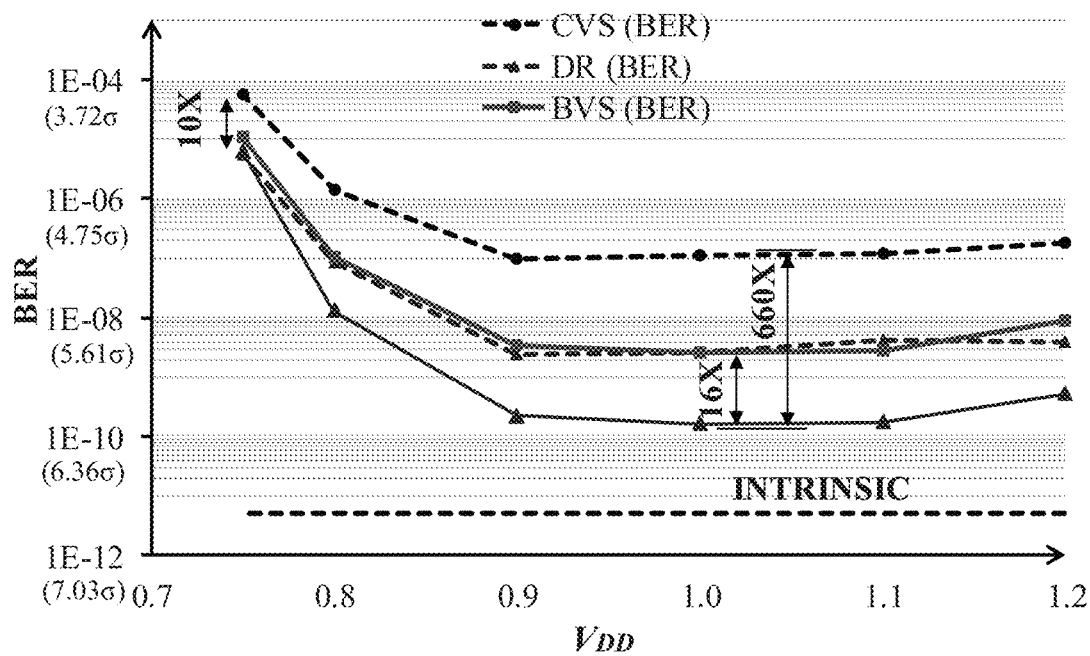
FIG. 13A shows a graph illustrating BER of the CVS scheme, BVS scheme, DR scheme according to example embodiments and the joint DR and BVS scheme according to example embodiments with X3 booster under 2% iso-area target, and supply voltage ranging from 0.75 V to 1.2 V.

The impact of voltage scaling will now be described. FIG. 13A reports the BER of the CVS scheme, BVS scheme, DR scheme according to example embodiments and the joint DR and BVS scheme according to example embodiments with X3 booster under 2% iso-area target, and supply voltage ranging from 0.75 V to 1.2 V. In the latter configuration, PN in the REFGEN circuit is adjusted for minimum BER by applying the optimal $V_{TUN}$ in FIG. 4A, which is calibrated at either design or testing time, and stored in a look-up table. The related circuitry is shared across all readout circuits across memory banks, leading to a negligible area and energy overhead. For the same reasons discussed above, the BER of the joint DR and BVS scheme according to example embodiments in FIG. 13A improves when reducing $V_{DD}$ from nominal voltage down to 0.9 V, and degrades at lower voltages. Across the above voltage range, the joint DR and BVS scheme according to example embodiments offers a substantial BER improvement over standalone BVS and CVS. Up to 16× (660×) BER improvement is observed over standalone BVS (CVS) at $V_{DD}$≥0.9 V. At $V_{DD}$<0.9 V, the BER improvement over standalone BVS (CVS) is reduced to 2-5× (10-80×).

Figure 13B:
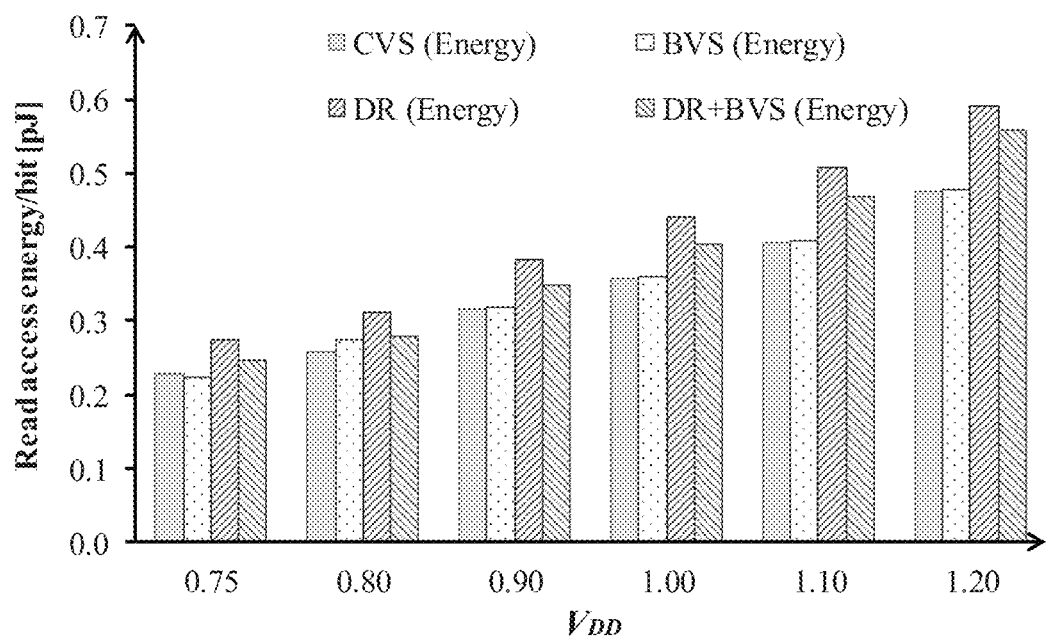
FIG. 13B shows a graph illustrating read access energy per bit of the CVS scheme, BVS scheme, DR scheme according to example embodiments and the joint DR and BVS scheme according to example embodiments with X3 booster under 2% iso-area target, and supply voltage ranging from 0.75 V to 1.2 V.

In regard to the energy, the bar chart in FIG. 13B shows that the joint DR and BVS scheme according to example embodiments has a consumption that is larger than BVS (CVS) by 17% (18%). Interestingly, the results confirm that the proposed DR scheme according to example embodiments can be synergistic with other robustness enhancement methods such as BVS, as it can simultaneously improve both BER and energy. Indeed, the joint scheme according to example embodiments consumes 6-10% less energy per bit than standalone DR according to example embodiments due to the ability to shut down the bitcell in the boosting and sensing phases, as discussed above.

In regard to the delay, the joint DR and BVS scheme according to example embodiments and the standalone BVS are both higher than CVS by up to 25%, mostly due to additional sampling phase and boosting phase of the booster. The addition of DR to BVS according to example embodiments does not cause any additional delay, as the REFGEN circuit operation is completely overlapped to the booster operation, as described above. Such energy and delay penalties are moderate and favorably compare with the above discussed improvement in the read robustness by orders of magnitude.

Further BER improvements can be achieved when adopting the joint DR and BVS scheme and higher-order booster according to example embodiments, i.e., tolerating larger area. For example, using a X3 booster according to an example embodiment leads to ≈500× BER reduction with negligible energy and delay penalty (as the booster's energy contribution is minor compared to the overall energy), under 2.5% readout area target.

In conclusion, embodiments of a dynamic reference (DR) scheme for STT-MRAMs have been described. This scheme according to example embodiments preferably enlarges the nominal read sensing margin to accommodate for a larger number of standard deviations before failure, thus improving the robustness. Quantitatively, the BER has been improved by two orders of magnitude (i.e., 1.1 standard deviations) according to example embodiments compared to the conventional voltage sensing scheme. Such a remarkable improvement in robustness is achieved at a reasonable area overhead of 5%, and performance (energy) penalty always lower than 10% (20%). If required, up to three orders of magnitude BER reduction can be achieved according to example embodiments, at larger area, performance and energy cost. The DR scheme according to example embodiments preferably does not modify the bitcell, the array organization and the sense amplifier. Thus, it is orthogonal to several existing techniques improving the robustness against variations. The synergy between the DR scheme according to example embodiments and the previously proposed BVS scheme has been demonstrated according to various example embodiments. Aa 6-standard deviation margin is achieved according to an example embodiment, corresponding to an improvement by one standard deviation at same area. Because the DR scheme according to example embodiments is based on voltage sensing, it preferably allows low-voltage operation and hence energy reduction compared to nominal voltage. Voltage reductions down to 0.9 V with same two-order of magnitude improvement in BER compared to CVS were shown, while maintaining the same area. Operating down to 0.75-0.8 V was also shown to be feasible, with up to 1.9× energy reduction compared to nominal voltage. Interestingly, the DR scheme according to example embodiments can be synergistic with BVS as the joint scheme according to example embodiments allows both BER (by 5-10×) and energy improvement (by 6-10%) compared to standalone DR according to example embodiments.

[The following is a typical "repetition" of the claim language.]

Figure 14:
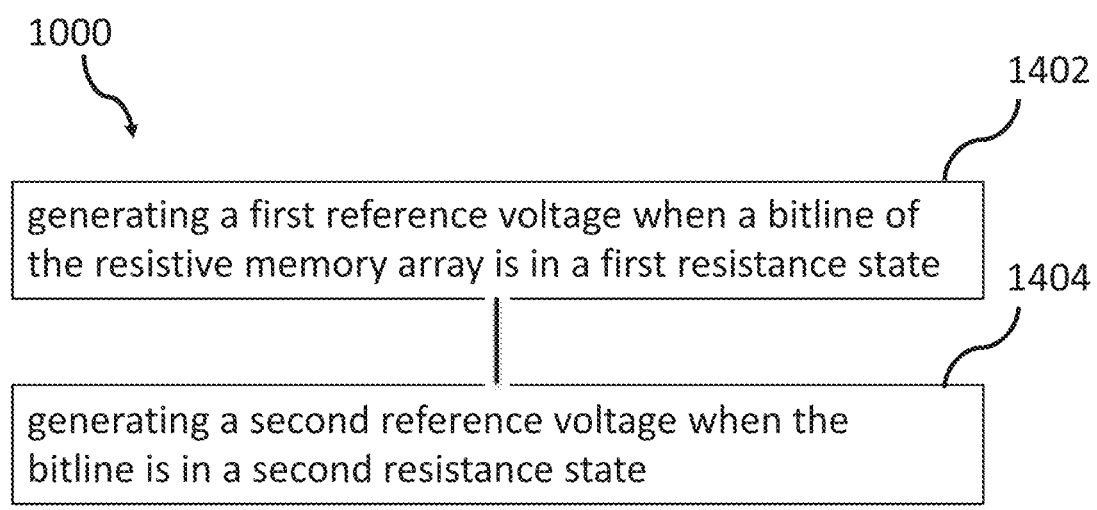
FIG. 14 shows a flow chart illustrating a method of providing a reference voltage for reading of a resistive memory array is provided, according to an example embodiment.

FIG. 14 shows a flow chart 1400 illustrating a method of providing a reference voltage for reading of a resistive memory array is provided, according to an example embodiment. At step 1402, a first reference voltage is generated when a bitline of the resistive memory array is in a first resistance state. At step 1404, a second reference voltage is generated when the bitline is in a second resistance state, wherein the first reference voltage is different from the first reference voltage and the first resistance state is different from the second resistance state.

In the first resistance state the bitline may exhibit a lower resistance compared to in the second resistance state, and the first reference voltage is larger than the second reference voltage.

Generating the first and second reference voltages may comprise applying a gain to a voltage of the bitline. The gain may be smaller than 1.

The gain may be chosen such that a bit error rate for reading in the first resistance state of the bitline is substantially the same as a bit error rate for reading in the second resistance state.

The method may comprise supply voltage scaling of an amplifier circuit for applying the gain to control read energy.

The method may further comprise applying an assist technique for improving read robustness. Manipulating the assist technique may comprise boosting the bitline voltage. The method may further comprise buffering the first or second reference voltage. The method may further comprise turning off a circuit for generating the first and second references voltages during sampling of the resistive memory array.

In one embodiment, a read circuit for reading of a resistive memory array is provided, the circuit comprising a reference voltage generating circuit for generating a first reference voltage when a bitline of the resistive memory array is in a first resistance state, and for generating a second reference voltage when the bitline is in a second resistance state, wherein the first reference voltage is different from the first reference voltage and the first resistance state is different from the second resistance state.

In the first resistance state the bitline may exhibit a lower resistance compared to in the second resistance state, and the first reference voltage is larger than the second reference voltage.

The reference voltage generating circuit may apply a gain to a voltage of the bitline in generating the first and second reference voltages. The gain may be smaller than 1.

The gain may be chosen such that a bit error rate for reading in the first resistance state of the bitline is substantially the same as a bit error rate for reading in the second resistance state.

The reference voltage generating circuit may be configured for supply voltage scaling to control read energy.

The read circuit may further comprise an assist circuit for applying an assist technique for improving read robustness. The assist circuit may boost the bitline voltage. The read circuit may further comprise a buffer for buffering the first or second reference voltage. The reference voltage generating circuit may be configured for turn off during sampling of the resistive memory array.

Embodiments of the present invention can have one or more of the following features and associates benefits/advantages.

| Feature | Benefit/Advantage |
| --- | --- |
| Reference voltage is adaptively generated as a lower (larger) value when sensing AP (P) state of the MTJ with higher (lower) bitline voltage is favorable for current sensing value. | Effectively enlarged the sensing margin (i.e., the difference between sensing voltage and reference voltage The technique mitigates the effect of the variations in the conventional sensing circuits (i.e., sense amplifier, fixed reference voltage generation) External reference is no longer required Can be applied for similar resistive memories (PC-RAM, ReRAM). |
| Voltage generator can be implemented as a non-linear attenuator (i.e., with the gain factor less than 1). The robustness enhancement technique in this invention is to modify the reference value without changing the bitcell circuit. | Energy, delay and area overhead due to introducing the reference generator circuit is small. The proposed technique can be applied jointly with other existing bitline boosting techniques. |

Commercial Applications of example embodiments include, but are not limited to:
  Improvements to the read-ability of STT-MRAMs, which is known to be poor due to process variations.
  Low-power and low voltage operation circuit applications.
  Minimum area, delay and energy overhead circuit applications.

Aspects of the systems and methods described herein may be implemented using underlying device technologies understood in the art, and which may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] D. Apalkov et al., "Spin-transfer torque magnetic random access memory (STT-MRAM)," *ACM Journal on Emerging Technologies in Computing Systems (JETC)*, vol. 9, no. 2, pp. 1-35, May 2013.

[2] Process Integration Difficult Challenges. (2013). International Technology Roadmap for Semiconductors, [Online] Available: http://www.itrs2.net/2013-itrs.html (2013PIDS.pdf).

[3] K. Trinh, S. Ruocco and M. Alioto, "Voltage Scaled STT-MRAMs Towards Minimum-Energy Write Access," in *IEEE JETCAS*, vol. 6, no. 3, pp. 305-318, April 2016.

[4] G. Jeong, W. Cho, S. Ahn, H. Jeong, G. Koh, Y. Hwang, and K. Kim, "A 0.24 μm 2.0V 1T1MTJ 16 kb NV magnetoresistance RAM with self reference sensing," in 2003 *IEEE ISSCC*, vol. 1, pp. 280-281.

[5] K. Trinh, S. Ruocco and M. Alioto, "Novel Boosted-Voltage Sensing Scheme for Variation-Resilient STT-MRAM Read," in *IEEE TCAS-I: Regular Papers*, vol. 63, no. 10, pp. 1652-1660, October 2016.

[6] Y. Chen, et al. "A 130 nm 1.2 V/3.3 V 16 Kb Spin-Transfer Torque random access memory with nondestructive self-reference sensing scheme," IEEE *JSSC*, vol. 47, no. 2, pp. 560-573, May 2012.

[7] J. DeBrosse et al., "A high-speed 128-kb MRAM core for future universal memory applications," *JSSC*, vol. 39, no. 4, pp. 678-683, April 2004.

[8] J. Kim, K. Ryu, S. H. Kang and S. Jung, "A novel sensing circuit for deep submicron spin transfer torque MRAM (STT-MRAM)," *IEEE Trans. on VLSI Syst.*, vol. 20, no. 1, pp. 219-224, January 2012.

[9] J. Kim, K. Ryu, J. P. Kim and S. H. Kang, "STT-MRAM Sensing Circuit with Self-body Biasing in Deep Submicron Technologies," in *IEEE Trans. on VLSI Syst.*, vol. 22, no. 7, pp. 1630-1634, July 2014.

[10] T. Na, J. Kim, J. P. Kim, S. H. Kang and S. Jung, "An Offset-Canceling Triple-Stage Sensing Circuit for Deep Submicrometer STT-RAM," in *IEEE Trans. on VLSI Syst.* vol. 22, no. 7, pp. 1620-1624, July 2014.

[11] T. Na, J. Kim, J. P. Kim, S. H. Kang and S. Jung, "A Double-Sensing-Margin Offset-Canceling Dual-Stage Sensing Circuit for Resistive Nonvolatile Memory," in *IEEE Trans. on Circuits and Systems II: Express Briefs*, vol. 62, no. 12, pp. 1109-1113, December 2015.

[12] T. Na et al., "An Offset-Tolerant Dual-Reference-Voltage Sensing Scheme for Deep Submicrometer STT-RAM," in *IEEE Trans. VLSI Syst.*, vol. 24, no. 4, pp. 1361-1370, April 2016.

[13] W. Kang, T. Pang, W. Lv and W. Zhao, "Dynamic Dual-Reference Sensing Scheme for Deep Submicrometer STT-MRAM," in IEEE *Transactions on Circuits and Systems I: Regular Papers*, vol. 64, no. 1, pp. 122-132, January 2017

[14] Hsin-Yi Ho et al., "Dual Reference Cell Sensing Scheme for Non-Volatile Memory," U.S. Patent 2004/0264249 A1, Dec. 30, 2004.

[15] Jefremow M. et al., "Differential Sensing Method and System for STT-MRAM," U.S. Pat. No. 8,837,210 B2, Sep. 16, 2014.

[16] Thomas Andre et al., "Self-Reference Sense amplifier for Spin Transfer Torque," U.S. Patent US 2013/0272060 A1, Oct. 17, 2013.

[17] Kang-Lung Wang et al. "Body Voltage Sensing Based on Short Pulse Reading Circuit," U.S. Pat. No. 8,917,562 B2, Dec. 23, 2014.

[18] David Mueller et al., "Symmetrical Differential Sensing Method and System for STT MRAM," U.S. Patent US 20150255136 A1, Sep. 10, 2015.

[19] Mihail Jefremow et al. "Mismatch Error Reduction Method and System for STT MRAM," U.S. Patent US 20140063923 A1, Mar. 6, 2014.

[20] R. E. Walpole, R. H. Myers, S. L. Myers, K. Ye, *Probability & Statistics for Engineers & Scientists*, Prentice Hall, 2006

[21] X. Fong S. K. Gupta, N. N. Mojumder, S. H. Choday, C. Augustine and K. Roy, "KNACK: A hybrid spin-charge mixed-mode simulator for evaluating different genres of spin-transfer torque MRAM bit-cells," in 2011 *Int. Conf. on Simulation of Semiconductor Processes and Devices*, pp. 51-54, September 2011.

[22] E. Chen et al., "Advances and Future Prospects of Spin-Transfer Torque Random Access Memory," in *IEEE Trans. Magn.*, vol. 46, no. 6, pp. 1873-1878, June 2010.

[23] Y. Huai et al., "PMTJ driven STT-MRAM with 300 mm process", in 2015 *IEEE Magnetics Conference (INTERMAG)*, Beijing, 2015, pp. 1-2.

[24] M. Abu-Rahma, et al., "Characterization of SRAM sense amplifier input offset for yield prediction in 28 nm CMOS," in Proc. of CICC, April 2011, pp. 1-4.

[25] X. Fong, Y. Kim, S. H. Choday and K. Roy, "Failure Mitigation Techniques for 1T-1MTJ Spin-Transfer Torque MRAM Bit-cells," in *IEEE Trans. VLSI Syst.*, vol. 22, no. 2, pp. 384-395, February 2014.

[26] M. Liu, Demystifying Switched Capacitor Circuits. Burlington, Vt., USA: Elsevier, May 2006, ch. 3, pp. 27-88.

[27] M. J. M. Pelgrom et al., "Matching properties of MOS transistors," *IEEE JSSC*, vol. 24, no. 5, pp. 1433-1439, October 1989.

The invention claimed is:

1. A method of providing a reference voltage for reading of a resistive memory array, the method comprising the steps of:
generating a first reference voltage when a bitline of the resistive memory array is in a first resistance state, and generating a second reference voltage when the bitline is in a second resistance state;
wherein the first reference voltage is different from the first reference voltage and the first resistance state is different from the second resistance state;
wherein generating the first and second reference voltages comprises applying a gain to a voltage of the bitline; and
wherein the gain is chosen such that a bit error rate for reading in the first resistance state of the bitline is substantially the same as a bit error rate for reading in the second resistance state.

2. The method of claim 1, wherein in the first resistance state the bitline exhibits a lower resistance compared to in the second resistance state, and the first reference voltage is larger than the second reference voltage.

3. The method of claim 1, wherein the gain is smaller than 1.

4. The method of claim 1, comprising supply voltage scaling of an amplifier circuit for applying the gain to control read energy.

5. The method of claim 1, further comprising applying an assist technique for improving read robustness.

6. The method of claim 5, wherein manipulating the assist technique comprises boosting the bitline voltage.

7. The method of claim 6, further comprising buffering the first or second reference voltage.

8. The method of claim 7, further comprising turning off a circuit for generating the first and second references voltages during sampling of the resistive memory array.

9. A read circuit for reading of a resistive memory array, the circuit comprising:
a reference voltage generating circuit for generating a first reference voltage when a bitline of the resistive memory array is in a first resistance state, and for generating a second reference voltage when the bitline is in a second resistance state, wherein the first reference voltage is different from the first reference voltage and the first resistance state is different from the second resistance state;
wherein the reference voltage generating circuit applies a gain to a voltage of the bitline in generating the first and second reference voltages; and
wherein the gain is chosen such that a bit error rate for reading in the first resistance state of the bitline is substantially the same as a bit error rate for reading in the second resistance state.

10. The read circuit of claim 9, wherein in the first resistance state the bitline exhibits a lower resistance compared to in the second resistance state, and the first reference voltage is larger than the second reference voltage.

11. The read circuit of claim 9, wherein the gain is smaller than 1.

12. The read circuit of claim 9, wherein the reference voltage generating circuit is configured for supply voltage scaling to control read energy.

13. The read circuit of claim 9, further comprising an assist circuit for applying an assist technique for improving read robustness.

14. The read circuit of claim 13, wherein the assist circuit boosts the bitline voltage.

15. The read circuit of claim 14, further comprising a buffer for buffering the first or second reference voltage.

16. The read circuit of claim 15, wherein the reference voltage generating circuit is configured for turn off during sampling of the resistive memory array.

\* \* \* \* \*